US012733365B2

(12) United States Patent
Youk et al.

(10) Patent No.: US 12,733,365 B2
(45) Date of Patent: Sep. 8, 2026

(54) DISPLAY APPARATUS

(71) Applicant: Samsung Display Co., Ltd., Yongin-si (KR)

(72) Inventors: Kikyung Youk, Yongin-si (KR); Hanbum Kwon, Yongin-si (KR); Cholong Won, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 387 days.

(21) Appl. No.: 18/465,306

(22) Filed: Sep. 12, 2023

(65) Prior Publication Data

US 2024/0147798 A1 May 2, 2024

(30) Foreign Application Priority Data

Oct. 26, 2022 (KR) ........................ 10-2022-0139675

(51) Int. Cl.
*H10K 59/131* (2023.01)

(52) U.S. Cl.
CPC ................................ *H10K 59/1315* (2023.02)

(58) Field of Classification Search
CPC ......................... H10K 59/1315; H10K 59/131
See application file for complete search history.

(56) References Cited

U.S. PATENT DOCUMENTS

| | | | |
|---|---|---|---|
| 7,098,986 B2 | 8/2006 | Park et al. | |
| 7,714,436 B2 | 5/2010 | Tanaka | |
| 8,168,527 B2 | 5/2012 | Lin et al. | |
| 9,276,230 B2 | 3/2016 | Kim | |
| 9,640,598 B2 | 5/2017 | Park et al. | |
| 10,510,821 B2 | 12/2019 | Jo et al. | |
| 10,770,533 B2 | 9/2020 | Park et al. | |
| 10,886,348 B2 | 1/2021 | Kim et al. | |
| 2006/0146214 A1 | 7/2006 | Hwang et al. | |
| 2019/0348487 A1 * | 11/2019 | Kim ..................... | H10K 59/131 |
| 2023/0247874 A1 | 8/2023 | Youk et al. | |

FOREIGN PATENT DOCUMENTS

| | | |
|---|---|---|
| JP | 4788100 | 10/2011 |
| KR | 10-0196291 | 6/1999 |
| KR | 10-0745415 | 8/2007 |
| KR | 10-2014-0077529 | 6/2014 |
| KR | 10-2017-0081105 | 7/2017 |
| KR | 10-2017-0140764 | 12/2017 |
| KR | 10-2019-0130091 | 11/2019 |
| KR | 10-2137474 | 7/2020 |
| KR | 10-2023-0110404 | 7/2023 |

* cited by examiner

*Primary Examiner* — Deeprose Subedi
(74) *Attorney, Agent, or Firm* — Lerner David LLP

(57) ABSTRACT

A display apparatus includes a substrate and pad terminals arranged on the substrate in a first direction in a pad area and including a first pad terminal disposed at outer side and an $i^{th}$ pad terminal disposed at inner side. Each of the pad terminals includes a lower conductive layer, convex portions, and an upper conductive layer. An overlapping area between the lower conductive layer of the first pad terminal and the convex portions is different from an overlapping area between the lower conductive layer of the $i^{th}$ pad terminal and the convex portions in a plan view.

22 Claims, 18 Drawing Sheets

DISPLAY APPARATUS

CROSS-REFERENCE TO RELATED APPLICATION(S)

This application claims priority to and benefits of Korean Patent Application No. 10-2022-0139675 under 35 U.S.C. § 119, filed on Oct. 26, 2022, in the Korean Intellectual Property Office (KIPO), the entire contents of which are incorporated herein by reference.

BACKGROUND

1. Technical Field

The disclosure relates to a display apparatus.

2. Description of the Related Art

Display apparatuses visually display data. A display apparatus includes a substrate that is divided into a display area and a peripheral area. In the display area, a scan line and a data line may be formed to be insulated from each other, and multiple pixels may be included. Also, in the display area, a thin-film transistor corresponding to each of the pixels and a sub-pixel electrode electrically connected to the thin-film transistor may be provided. Also, in the display area, a counter electrode commonly provided for the pixels may be provided. In the peripheral area, various wirings for transmitting an electrical signal to the display area, a scan driving unit, a data driving unit, a control unit, and a pad unit may be provided.

Display apparatuses have been used for various purposes. Accordingly, various designs have been attempted to improve the quality of display apparatuses.

SUMMARY

The disclosure includes a display apparatus with improved connection reliability between a pad terminal and a driving terminal. However, the embodiments are examples, and do not limit the scope of the disclosure.

Additional aspects will be set forth in part in the description which follows and, in part, will be apparent from the description, or may be learned by practice of the presented embodiments.

According to an embodiment, a display apparatus may include a substrate, and n pad terminals disposed on the substrate, arranged in a first direction in a pad area, and including a first pad terminal disposed at outer side from among the n pad terminals in the first direction and an $i^{th}$ pad terminal disposed at inner side from among the n pad terminals in the first direction. n may be a natural number greater than or equal to 3, and i may be greater than 1 and less than n. Each of the first pad terminal and the $i^{th}$ pad terminal may include a lower conductive layer, convex portions on the lower conductive layer, and an upper conductive layer disposed on the convex portions and electrically connected to the lower conductive layer. An overlapping area between the lower conductive layer of the first pad terminal and the convex portions of the first pad terminal may be different from an overlapping area between the lower conductive layer of the $i^{th}$ pad terminal and the convex portions of the $i^{th}$ pad terminal in a plan view.

A thickness of each of the convex portions of the first pad terminal may be less than a thickness of each of the convex portions of the $i^{th}$ pad terminal in a thickness direction of the substrate.

An overlapping area between the lower conductive layer of the first pad terminal and the convex portions of the first pad terminal may be less than an overlapping area between the lower conductive layer of the $i^{th}$ pad terminal and the convex portions of the $i^{th}$ pad terminal in a plan view.

A width of a bottom surface of each of the convex portions of the first pad terminal may be less than a width of a bottom surface of each of the convex portions of the $i^{th}$ pad terminal in a second direction crossing the first direction.

An overlapping area between the lower conductive layer of the first pad terminal and the convex portions of the first pad terminal may be greater than an overlapping area between the lower conductive layer of the $i^{th}$ pad terminal and the convex portions of the $i^{th}$ pad terminal in a plan view.

A number of the convex portions of the first pad terminal disposed on the lower conductive layer of the first pad terminal may be greater than a number of the convex portions of the $i^{th}$ pad terminal disposed on the lower conductive layer of the $i^{th}$ pad terminal.

A height of each of the convex portions of the first pad terminal and a height of each of the convex portions of the $i^{th}$ pad terminal may be same in a thickness direction of the substrate.

A width of a bottom surface of at least one of the convex portions of the first pad terminal disposed on the lower conductive layer of the first pad terminal may be greater than a width of a bottom surface of at least one of the convex portions of the $i^{th}$ pad terminal disposed on the lower conductive layer of the $i^{th}$ pad terminal in a second direction crossing the first direction.

A height of each of the convex portions of the first pad terminal and a height of each of the convex portions of the $i^{th}$ pad terminal may be same in a thickness direction of the substrate.

The display apparatus may further include an integrated circuit device disposed on the n pad terminals. The integrated circuit device may directly contact the upper conductive layer.

The display apparatus may further include an adhesive tape disposed in a space between the n pad terminals.

The adhesive tape may be a non-conductive film (NCF).

The lower conductive layer may include a first lower conductive layer, an insulating layer covering an edge of the first lower conductive layer and including an opening overlapping a part of the first lower conductive layer in a plan view, and a second lower conductive layer electrically connected to the first lower conductive layer through the opening of the insulating layer.

The upper conductive layer may be disposed on a top surface and a side surface of each of the convex portions and directly contact the lower conductive layer.

According to an embodiment, a display apparatus may include a substrate, and a pad terminal disposed on the substrate in a pad area. The pad terminal may include a lower conductive layer, a plurality of convex portions disposed on the lower conductive layer, and an upper conductive layer disposed on the plurality of convex portions and electrically connected to the lower conductive layer. The plurality of convex portions may be arranged in a first direction and include an outer convex portion disposed at outer side of the pad terminal and an inner convex portion disposed at inner side than the outer convex portion. A cross-sectional shape of the outer convex portion may be different from a cross-sectional shape of the inner convex portion.

A width of a bottom surface of the outer convex portion may be greater than a width of a bottom surface of the inner convex portion in a second direction crossing the first direction.

The outer convex portion may include a first portion having a first thickness, and a second portion integrally connected to the first portion and having a second thickness less than the first thickness in a thickness direction of the substrate.

A thickness of the inner convex portion and the first thickness of the outer convex portion may be substantially same in the thickness direction.

The display apparatus may further include an integrated circuit device disposed on the pad terminal. The integrated circuit device may directly contact the upper conductive layer.

The display apparatus may further include an adhesive tape disposed in a space between a plurality of the pad terminals.

The lower conductive layer may include a first lower conductive layer, an insulating layer covering an edge of the first lower conductive layer and including an opening overlapping a part of the first lower conductive layer in a plan view, and a second lower conductive layer electrically connected to the first lower conductive layer through the opening of the insulating layer.

The upper conductive layer may be disposed on a top surface and a side surface of each of the plurality of convex portions and directly contact the lower conductive layer.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION OF THE EMBODIMENTS

Figure 1:
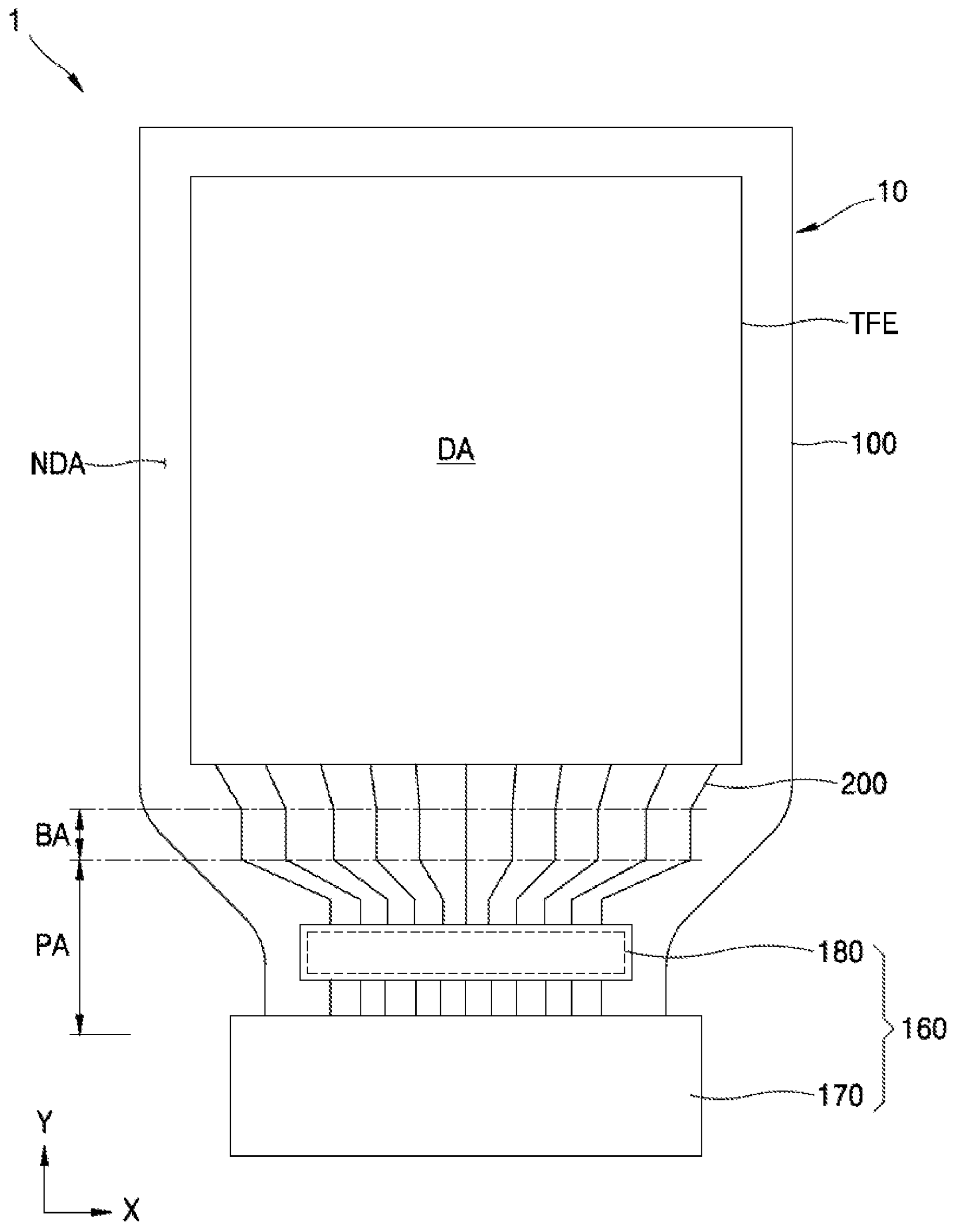
FIG. 1 is a schematic plan view illustrating a display apparatus, according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Reference will now be made in detail to embodiments, examples of which are illustrated in the accompanying drawings, and in the drawings, the same elements are denoted by the same reference numerals, and thus a repeated description thereof will be omitted.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be further understood that the terms "comprises", "comprising", "includes", and/or "including" when used in this specification, specify the presence of stated features, integers, steps, operations, elements, components, and/or groups thereof, but do not preclude the presence or addition of one or more other features, integers, steps, operations, elements, components, and/or groups thereof.

It will be further understood that, when a layer, region, or component is referred to as being "on" another layer, region, or component, it may be directly on the other layer, region, or component, or may be indirectly on the other layer, region, or component with intervening layers, regions, or components therebetween.

Sizes of components in the drawings may be exaggerated or contracted for convenience of explanation. For example, because sizes and thicknesses of elements in the drawings are arbitrarily illustrated for convenience of explanation, the disclosure is not limited thereto.

When a certain embodiment may be implemented differently, a specific process order may be different from the described order. For example, two consecutively described processes may be performed substantially at the same time or may be performed in an order opposite to the described order.

When an element, or a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Figure 2:
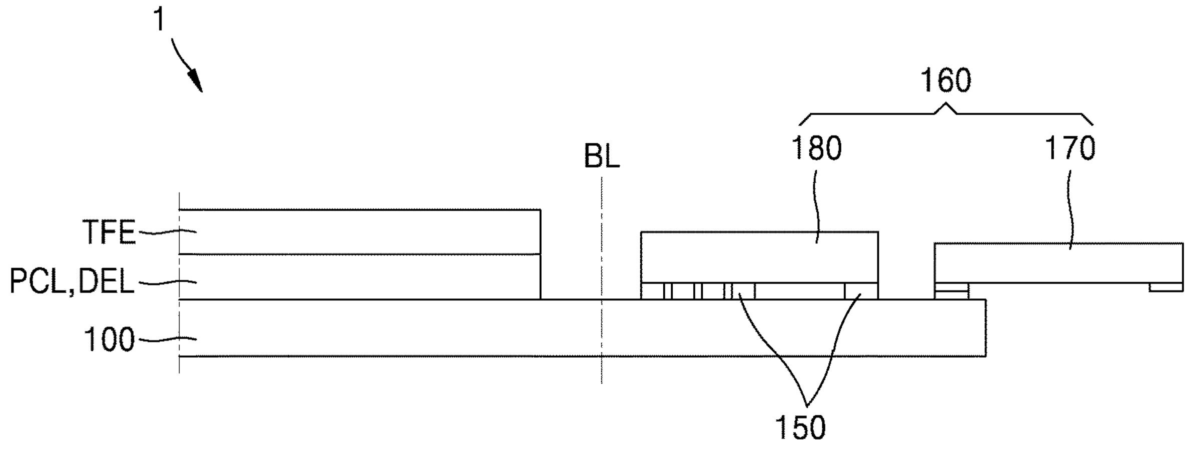
FIG. 2 is a schematic cross-sectional view illustrating a display apparatus, according to an embodiment.

FIG. 1 is a schematic plan view illustrating a display apparatus, according to an embodiment. FIG. 2 is a schematic cross-sectional view illustrating a display apparatus, according to an embodiment.

Referring to FIGS. 1 and 2, a display apparatus 1 may include a display panel 10. In an embodiment, the display apparatus 1 may be an organic light-emitting display apparatus. In another embodiment, the display apparatus 1 may be a liquid crystal display, a field emission display (FED), or an electronic paper display.

Figure 3:
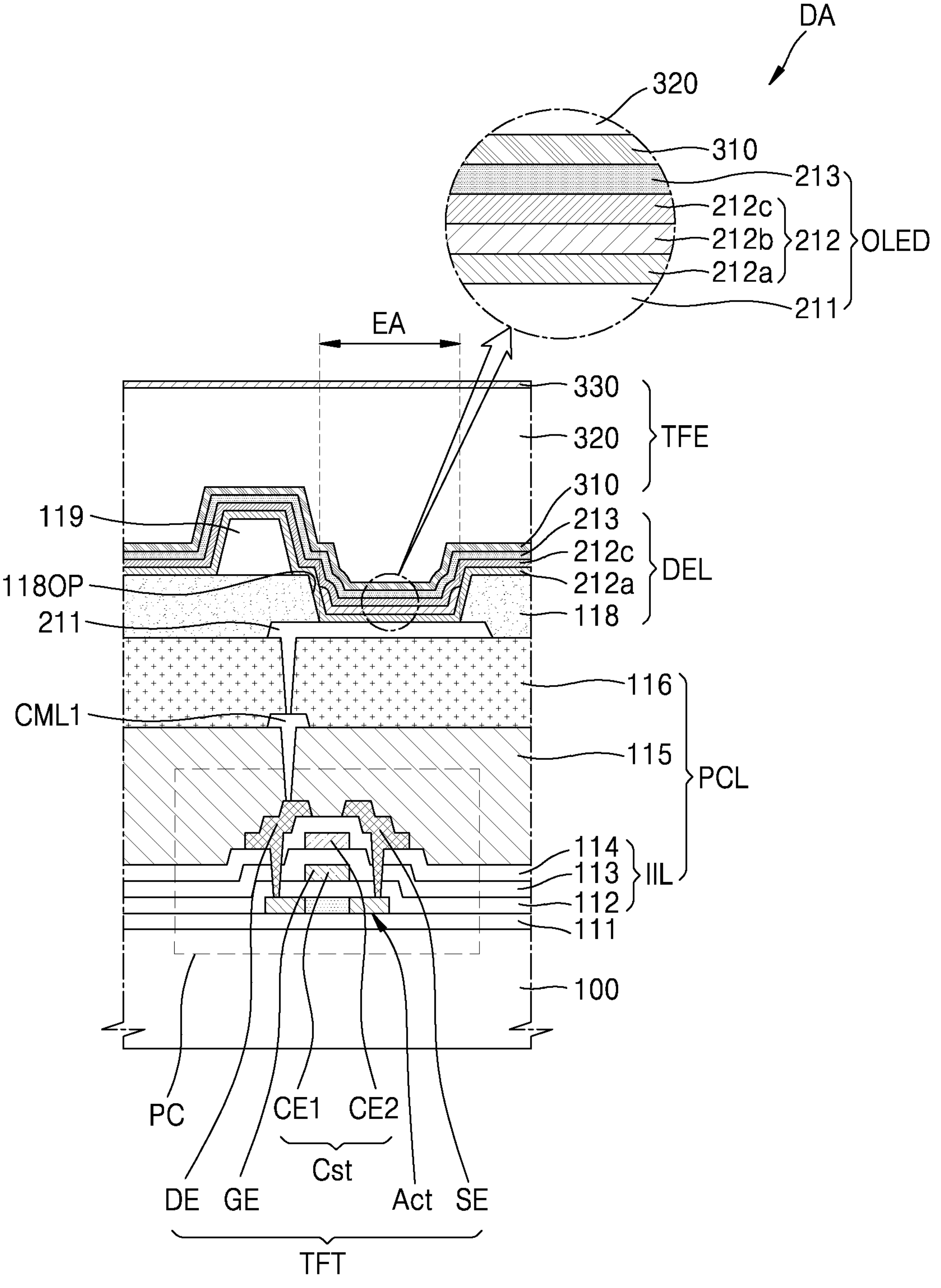
FIG. 3 is a schematic cross-sectional view illustrating a display area of a display apparatus, according to an embodiment.

The display panel 10 may include a substrate 100 including multiple pixels, a pixel circuit layer PCL including a thin-film transistor TFT (see FIG. 3), a display element layer DEL including an organic light-emitting diode OLED (see FIG. 3), and a thin-film encapsulation layer TFE covering the organic light-emitting diode OLED (see FIG. 3). The pixel circuit layer PCL and the display element layer DEL may be located on the substrate 100, and the thin-film encapsulation layer TFE may be located on the display element layer DEL. The pixel circuit layer PCL and the display element layer DEL may be located in a display area DA, and the thin-film encapsulation layer TFE may cover the display area DA. A functional film (not shown) such as a polarization layer, a touch sensing unit, or a cover window may be located on the thin-film encapsulation layer TFE.

The substrate 100 may include the display area DA where an image is displayed and a non-display area NDA extending outward from at least a portion of the display area DA. The display area DA may include multiple pixels including a light-emitting diode (e.g., an organic light-emitting diode OLED) electrically connected to a thin-film transistor TFT. The non-display area NDA where pixels are not located may be disposed adjacent to the display area DA. The non-display area NDA may include a bending area BA where the display panel 10 may be bent in a direction and a pad area PA extending from the bending area BA. The pad area PA that is a portion of the non-display area NDA disposed adjacent to the display area DA may be located on a side of the display area DA. For example, the pad area PA may be located adjacent to a side of the display area DA as shown in FIG. 1. The bending area BA may be located between the display area DA and the pad area PA. The display panel 10 may be bent in a direction along a bending line BL located in the bending area BA.

Multiple pad terminals 150 may be located in the pad area PA. The pad terminals 150 may be spaced apart from each other in the pad area PA of the substrate 100. For example, the pad terminals 150 may be arranged in rows in a direction (e.g., Y direction) on the substrate 100. The pad terminals 150 may be connected to a wiring 200 extending from the display area DA. In the embodiment, the X direction may be perpendicular to the Y direction.

A driving unit 160 may be electrically connected to the pad terminals 150. The driving unit 160 may include a driving chip. The driving chip may be mounted by using, for example, a chip on plastic (COP) method. In another embodiment, the driving unit 160 may be mounted by using a chip on film (COF) method. In another embodiment, the driving unit 160 may be mounted by using a chip on glass (COG) method. The following will be described assuming that a COP method is applied to the driving unit 160.

The driving unit 160 may include a flexible circuit board 170 where a circuit wiring is patterned and a driving member 180 including an integrated circuit device or the like. The flexible circuit board 170 and the driving member 180 may be electrically connected to each other. The flexible circuit board 170 may be electrically connected to an external board.

The driving unit 160 may be located in the pad area PA of the display panel 10. The driving member 180 of the driving unit 160 may be electrically connected to the pad terminals 150. For example, the pad terminals 150 and multiple bumps of the driving member 180 corresponding to the pad terminals 150 may be connected (e.g., directed connected) to each other. In an embodiment, the bump of the driving member 180 may directly contact the pad terminal 150 with no intervening layer or element therebetween.

The display apparatus 1 having the above structure may electrically connect the pad terminal 150 to the driving member 180 by using a pressing device such as a hot bar. Although the pad terminal 150 and the driving member 180 are connected to each other in the embodiment, the disclosure is not limited as long as terminals located on different elements are connected to each other.

FIG. 3 is a schematic cross-sectional view illustrating a display area of a display apparatus, according to an embodiment.

Referring to FIG. 3, a display panel may include the substrate 100, a buffer layer 111, the pixel circuit layer PCL, the display element layer DEL, and the thin-film encapsulation layer TFE.

The buffer layer 111 may include an inorganic insulating material such as silicon nitride, silicon oxynitride, or silicon oxide, and may have a single or multi-layer structure including the above inorganic insulating material.

The pixel circuit layer PCL may be located on the buffer layer 111. The pixel circuit layer PCL may include a thin-film transistor TFT included in a pixel circuit PC, and an inorganic insulating layer IIL, a first planarization layer 115, and a second planarization layer 116 located under and/or over elements of the thin-film transistor TFT. The inorganic insulating layer IIL may include a first gate insulating layer 112, a second gate insulating layer 113, and an interlayer insulating layer 114.

In an embodiment, the thin-film transistor TFT may include a semiconductor layer Act, and the semiconductor layer Act may include polysilicon. In another embodiment, the semiconductor layer Act may include amorphous silicon, an oxide semiconductor, or an organic semiconductor. The semiconductor layer Act may include a channel region, and a drain region and a source region located on each side of the channel region. A gate electrode GE may overlap the channel region in a plan view.

The gate electrode GE may include a low-resistance metal. The gate electrode GE may include a conductive material including molybdenum (Mo), aluminum (Al), copper (Cu), or titanium (Ti), and may have a single or multi-layer structure including the above material.

The first gate insulating layer 112 between the semiconductor layer Act and the gate electrode GE may include an inorganic insulating material such as silicon oxide, silicon nitride, silicon oxynitride, aluminum oxide, titanium oxide, tantalum oxide, hafnium oxide, or zinc oxide.

The second gate insulating layer 113 may cover the gate electrode GE. The second gate insulating layer 113 may include an inorganic insulating material such as silicon oxide, silicon nitride, silicon oxynitride, aluminum oxide, titanium oxide, tantalum oxide, hafnium oxide, or zinc oxide, similar to the first gate insulating layer 112.

An upper electrode CE2 of a storage capacitor Cst may be located on the second gate insulating layer 113. The upper electrode CE2 may overlap the gate electrode GE that is located below the upper electrode CE2 in a plan view. The gate electrode GE and the upper electrode CE2 overlapping each other with the second gate insulating layer 113 therebetween may constitute the storage capacitor Cst of the pixel circuit PC. For example, the gate electrode GE may act as a lower electrode CE1 of the storage capacitor Cst.

As such, the storage capacitor Cst and the thin-film transistor TFT may overlap each other. In some embodiments, the storage capacitor Cst may not overlap the thin-film transistor TFT.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single or multi-layer structure including the above material.

The interlayer insulating layer 114 may cover the upper electrode CE2. The interlayer insulating layer 114 may include an inorganic insulating material such as silicon oxide, silicon nitride, silicon oxynitride, aluminum oxide, titanium oxide, tantalum oxide, hafnium oxide, or zinc oxide. The interlayer insulating layer 114 may have a single or multi-layer structure including the above inorganic insulating material.

Each of a drain electrode DE and a source electrode SE may be located on the interlayer insulating layer 114. Each of the drain electrode DE and the source electrode SE may include a material having excellent conductivity. Each of the drain electrode DE and the source electrode SE may include a conductive material including molybdenum (Mo), aluminum (Al), copper (Cu), or titanium (Ti), and may have a single or multi-layer structure including the above material. In an embodiment, each of the drain electrode DE and the source electrode SE may have a multi-layer structure such as Ti/Al/Ti.

The first planarization layer 115 may cover the drain electrode DE and the source electrode SE. The first planarization layer 115 may include an organic insulating layer. The first planarization layer 115 may include an organic insulating material such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

A first connection electrode CML1 may be located on the first planarization layer 115. The first connection electrode CML1 may be connected to the drain electrode DE or the source electrode SE through a contact hole of the first planarization layer 115. The first connection electrode CML1 may include a material having excellent conductivity. The first connection electrode CML1 may include a conductive material including molybdenum (Mo), aluminum (Al), copper (Cu), or titanium (Ti), and may have a single or multi-layer structure including the above material. In an embodiment, the first connection electrode CML1 may have a multi-layer structure such as Ti/Al/Ti.

The second planarization layer 116 may cover the first connection electrode CML1. The second planarization layer 116 may include an organic insulating layer. The second planarization layer 116 may include an organic insulating material such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

The display element layer DEL may be located on the pixel circuit layer PCL. The display element layer DEL may include an organic light-emitting diode OLED, and a pixel electrode 211 of the organic light-emitting diode OLED may be electrically connected to the first connection electrode CML1 through a contact hole of the second planarization layer 116.

The pixel electrode 211 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 211 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 211 may further include a film formed of ITO, IZO, ZnO, or $In_2O_3$ over/under the reflective film.

A bank layer 118 having an opening 118OP through which a central portion of the pixel electrode 211 is exposed may be located on the pixel electrode 211. The bank layer 118 may include an organic insulating material and/or an inorganic insulating material. The opening 118OP may define an emission area EA of light emitted by the organic light-emitting diode OLED. For example, a width of the opening 118OP may correspond to a width of the emission area EA in a direction.

A spacer 119 may be located on the bank layer 118. The spacer 119 may prevent damage to the substrate 100 in a method of manufacturing a display apparatus. A mask sheet may be used in a method of manufacturing a display panel, and the spacer 119 may prevent the problem that the mask sheet is introduced into the opening 118OP of the bank layer 118 or is closely attached to the bank layer 118 and thus, a part of the substrate 100 is damaged by the mask sheet when a deposition material is deposited on the substrate 100.

In an embodiment, the spacer 119 may include an organic insulating material such as polyimide. In another embodiment, the spacer 119 may include an inorganic insulating material such as silicon nitride or silicon oxide. In another embodiment, the spacer 119 may include an organic insulating material and an inorganic insulating material.

In an embodiment, the spacer 119 and the bank layer 118 may include different materials. In another embodiment, the spacer 119 and the bank layer 118 may include a same material, and the bank layer 118 and the spacer 119 may be formed together in a mask process using a halftone mask or the like.

An intermediate layer 212 may be located on the bank layer 118. The intermediate layer 212 may include an emission layer 212*b* located in the opening 118OP of the bank layer 118. The emission layer 212*b* may include a high molecular weight organic material or a low molecular weight organic material emitting light of a certain color.

A first functional layer 212*a* and a second functional layer 212*c* may be respectively located under and over the emission layer 212*b*. The first functional layer 212*a* may include, for example, a hole transport layer (HTL), or may include an HTL and a hole injection layer (HIL). The second functional layer 212*c* located over the emission layer 212*b* may be optional. The second functional layer 212*c* may include an electron transport layer (ETL) and/or an electron injection layer (EIL). The first functional layer 212*a* and/or the second functional layer 212*c* may be a common layer entirely covering the substrate 100, like a counter electrode 213 described below.

The counter electrode 213 may be formed of a conductive material having a low work function. For example, the counter electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In an embodiment, the counter electrode 213 may further include a layer formed of ITO, IZO, ZnO, or $In_2O_3$ on the (semi) transparent layer including the above material.

In some embodiments, a capping layer (not shown) may be further located on the counter electrode 213. The capping layer may include LiF, an inorganic material, and/or an organic material.

The thin-film encapsulation layer TFE may be located on the counter electrode 213. In an embodiment, the thin-film encapsulation layer TFE may include at least one inorganic encapsulation layer and at least one organic encapsulation layer. FIG. 3 illustrates that the thin-film encapsulation layer TFE includes a first inorganic encapsulation layer 310, an organic encapsulation layer 320, and a second inorganic encapsulation layer 330 that are sequentially stacked. However, the disclosure is not limited thereto.

Each of the first inorganic encapsulation layer 310 and the second inorganic encapsulation layer 330 may include at least one inorganic material of aluminum oxide, titanium oxide, tantalum oxide, hafnium oxide, zinc oxide, silicon oxide, silicon nitride, and silicon oxynitride. The organic encapsulation layer 320 may include a polymer-based material. Examples of the polymer-based material may include an acrylic resin, an epoxy resin, polyimide, and polyethylene. In an embodiment, the organic encapsulation layer 320 may include acrylate.

Although not shown in FIG. 3, a touch electrode layer may be located on the thin-film encapsulation layer TFE, and an optical functional layer may be located on the touch electrode layer. The touch electrode layer may obtain coordinate information according to an external input, for example, a touch event. The optical functional layer may reduce a reflectance of light (external light) incident on the display apparatus, and/or improve color purity of light emitted from the display apparatus. In an embodiment, the optical functional layer may include a phase retarder and/or a polarizer. The phase retarder may be a film-type phase retarder or a liquid crystal coating-type phase retarder, and may include a λ/2 phase retarder and/or a λ/4 phase retarder. The polarizer may be a film-type polarizer or a liquid crystal coating-type polarizer. The film-type polarizer may include a stretchable synthetic resin film, and the liquid crystal coating-type polarizer may include liquid crystals arranged in an arrangement. In an embodiment, although not shown in FIG. 3, the display panel may further include a protective film on the phase retarder and the polarizer.

In another embodiment, the optical functional layer may include a black matrix and color filters. The color filters may be arranged in consideration of a color of light emitted by each of pixels of the display apparatus. The color filters may include a red, green, or blue pigment or dye. In an embodiment, each of the color filters may further include quantum dots in addition to the pigment or dye. In an embodiment, some of the color filters may not include the pigment or dye, and may include scattering particles including titanium oxide.

In another embodiment, the optical functional layer may have a destructive interference structure. The destructive interference structure may include a first reflective layer and a second reflective layer that are located on different layers. First reflected light and second reflected light respectively reflected by the first reflective layer and the second reflective layer may be destructively interfered with each other, thereby reducing a reflectance of external light.

An adhesive member may be located between the touch electrode layer and the optical functional layer. The adhesive member may be a general one without limitation. The adhesive member may be a pressure sensitive adhesive (PSA).

Figure 4:
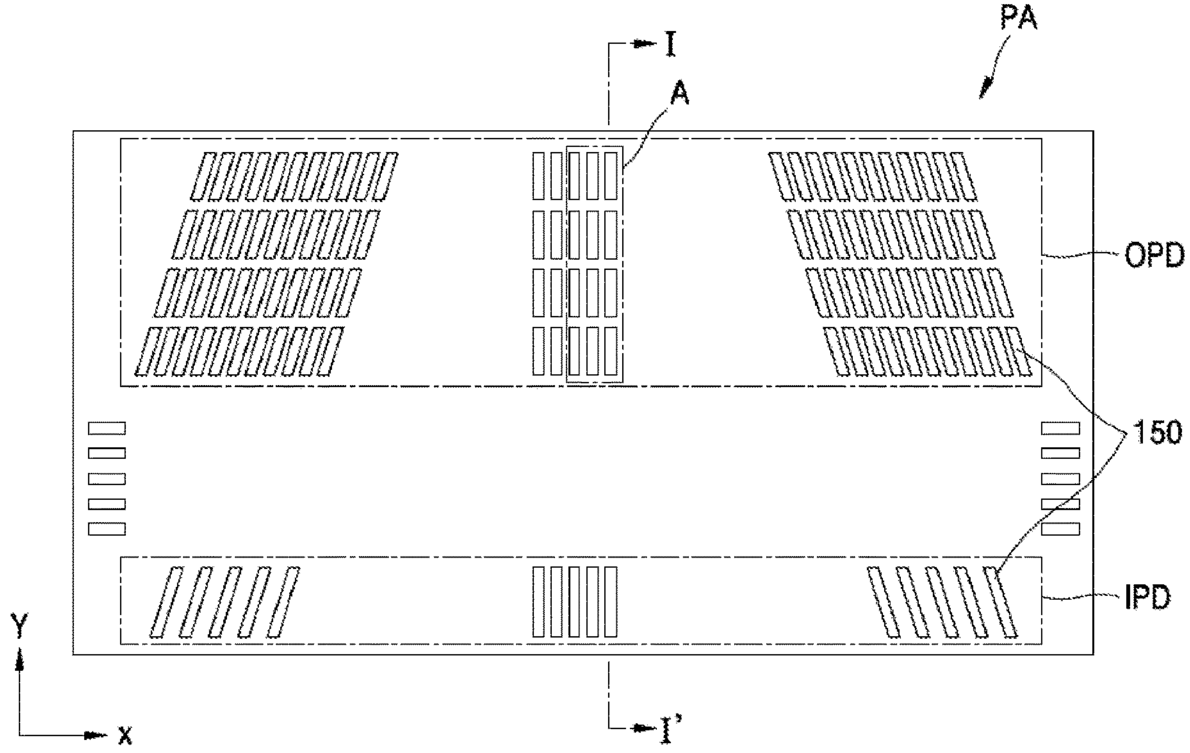
FIG. 4 is a schematic plan view illustrating a pad area of a display apparatus, according to an embodiment.
Figure 5:
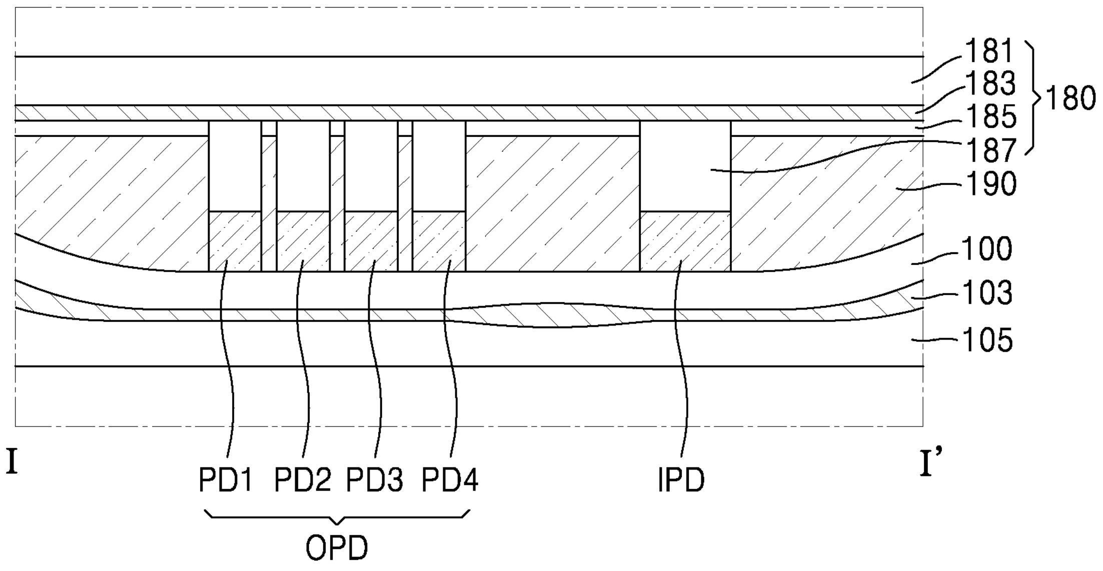
FIG. 5 is a schematic cross-sectional view taken along line I-I' of FIG. 4.

FIG. 4 is a schematic plan view illustrating a pad area of a display apparatus, according to an embodiment. FIG. 5 is a schematic cross-sectional view taken along line I-I' of FIG. 4.

Referring to FIG. 4, multiple pad terminals 150 may be located in the pad area PA. The pad area PA may include an input pad IPD (e.g., a first pad) disposed adjacent to the flexible circuit board 170 (see FIG. 2) and an output pad OPD (e.g., a second pad) disposed adjacent to the display area DA. The input pad IPD may receive a signal from the flexible circuit board 170 and may transmit the signal to the driving member 180, and the output pad OPD may receive a signal output from the driving member 180 and transmit to the pixels in the display area DA. The input pad IPD and the output pad OPD may be spaced apart from each other in a second direction (e.g., Y direction).

The pad terminals 150 located on the input pad IPD and the output pad OPD may be arranged in a first direction (e.g., X direction). The pad terminals 150 of the input pad IPD arranged in the first direction (e.g., X direction) may form one row. The pad terminals 150 of the output pad OPD may be arranged in the second direction (e.g., Y direction), and the pad terminals 150 of the output pad OPD may include multiple rows. In an embodiment, as shown in FIG. 4, the pad terminals 150 of the output pad OPD may form four rows. Each row may extend in the first direction (e.g., X direction), and adjacent rows may be spaced apart from each other in the second direction (e.g., Y direction).

Although FIG. 4 illustrates that the input pad IPD includes the pad terminals 150 in one row, the disclosure is not limited thereto. In another embodiment, the pad terminals 150 of the input pad IPD may also include multiple rows. Also, although FIG. 4 illustrates that the output pad OPD includes the pad terminals 150 in four rows, the disclosure is not limited thereto. In another embodiment, the pad terminals 150 of the output pad OPD may include one row or multiple rows.

Referring to FIG. 5, the input pad IPD and the output pad OPD may be located on a surface of the substrate 100, and a protective film 105 may be located on another surface of the substrate 100.

The substrate 100 may have a multi-layer structure including a base layer including a polymer resin and an inorganic layer. For example, the substrate 100 may include polyimide (PI), polyethersulfone (PES), polyarylate, polyetherimide (PEI), polyethylene napthalate (PEN), polyethylene terephthalate (PET), polyphenylene sulfide (PPS), polycarbonate (PC), cellulose triacetate (TAC), and/or cellulose acetate propionate (CAP). A barrier layer may include an inorganic insulating material such as silicon oxide, silicon oxynitride, or silicon nitride. In an embodiment, the substrate 100 may be formed of polyimide (PI).

The protective film 105 may be located on another surface of the substrate 100. The protective film 105 may be attached to the bottom of the display panel 10 (see FIG. 2) to protect the display panel 10. For example, the protective film 105 may include at least one material of polyethylene terephthalate (PET), polyethylene naphthalate (PEN), polyethylene sulfide (PES), and polyethylene (PE). In an embodiment, the protective film 105 may be formed of PET.

An adhesive layer 103 may be located between the substrate 100 and the protective film 105 to bond the substrate 100 to the protective film 105. For example, a surface of the adhesive layer 103 may contact the substrate 100 and another surface of the adhesive layer 103 may contact the protective film 105. For example, the adhesive layer 103 may include a photocurable resin or a thermosetting resin having a high transmittance and adhesive performance. For example, the adhesive layer 103 may be obtained by applying a resin such as acryl and irradiating ultraviolet (UV) rays to cure the resin. In another example, the adhesive layer 103 may be one of a pressure sensitive adhesive (PSA), an optically clear adhesive (OCA), and an optically clear resin (OCR). In an embodiment, the adhesive layer 103 may be a PSA.

The input pad IPD and the output pad OPD may be located on the surface of the substrate 100. Each of the input pad IPD and the output pad OPD may include multiple pad terminals 150. As described above, in an embodiment, the pad terminals 150 of the input pad IPD may form one pad row, and the pad terminals 150 of the output pad OPD may form multiple pad rows. The pad rows in which the pad terminals 150 of the output pad OPD are arranged in the first direction (e.g., X direction) may include a first pad group PD1, a second pad group PD2, a third pad group PD3, and a fourth pad group PD4.

The driving member 180 may overlap the pad terminals 150 in a plan view. For example, the driving member 180 may be located on the input pad IPD and the output pad OPD. The driving member 180 may include a driving IC 181 (or integrated circuit device), a circuit pattern 183, an insulating film 185, and multiple bumps 187. The insulating film 185 may cover a part of the circuit pattern 183. The circuit pattern 183 may be electrically connected to the bumps 187. The bumps 187 may be formed of at least one of gold (Au), nickel (Ni), and tin (Sn).

The driving member 180 may be electrically connected to the input pad IPD and the output pad OPD located in the pad area PA. For example, multiple pad terminals 150 may be located in the pad area PA, and multiple bumps 187 of the driving member 180 may be electrically connected to the pad terminals 150. In an embodiment, the bumps 187 of the driving member 180 may directly contact the pad terminals 150 with no intervening layer or element therebetween.

A coupling member 190 may be located in a space between adjacent pad terminals 150. The coupling member 190 may bond the surface of the substrate 100 on which the pad terminals 150 are located to a surface of the driving member 180. The coupling member 190 may insulate adjacent pad terminals 150, to prevent a short-circuit between the adjacent pad terminals 150. The coupling member 190 may include an adhesive insulating resin. For example, the coupling member 190 may include a non-conductive film (NCF). However, the disclosure is not limited thereto, and the coupling member 190 may include a general adhesive.

However, in a process of coupling the bumps 187 of the driving member 180 to the pad terminals 150, stress may be applied to a portion of the substrate 100. In case that stress applied to the substrate 100 is large, the adhesive layer 103 of the substrate 100 including a PSA may be pushed. For example, the adhesive layer 103 may be deformed so that a thickness at the center of a portion where the pad terminals 150 are located decreases and a thickness at the periphery of the portion where the pad terminals 150 are located increases. Accordingly, in case that the driving member 180 and the pad terminal 150 are bonded to each other, stress may be concentrated on edges of the bumps 187 and the pad terminals 150 and around them.

In case that the adhesive layer 103 is pushed and deformed as shown in FIG. 5, pressure applied to the second pad group PD2 and the third pad group PD3 located at the center of the output pad OPD may be reduced. In case that pressure applied to the second pad group PD2 and the third pad group PD3 is less than pressure applied to the first pad group PD1 and the fourth pad group PD4, contact pressure on the second pad group PD2 and the third pad group PD3 may be insufficient. Because a bonding gap between the second pad group PD2 and the third pad group PD3 and the bumps 187 is large, poor contact may occur and resistance may increase in the second pad group PD2 and the third pad group PD3.

In order to solve the problems, in the case of a foldable product, the pad terminals 150 and the driving member 180 may be coupled to each other by increasing pressure. However, in case that pressure is applied above a certain level, cracks may occur in wirings at a portion around the pad terminals 150, and thus, bonding quality of the driving member 180 may be degraded or a driving failure of the driving IC 181 may be caused. However, according to embodiments, because a structure described with reference to FIGS. 6 to 16 is provided, stress may be effectively distributed and thus, pressure may be uniformly applied to the pad terminals 150.

Figure 6:
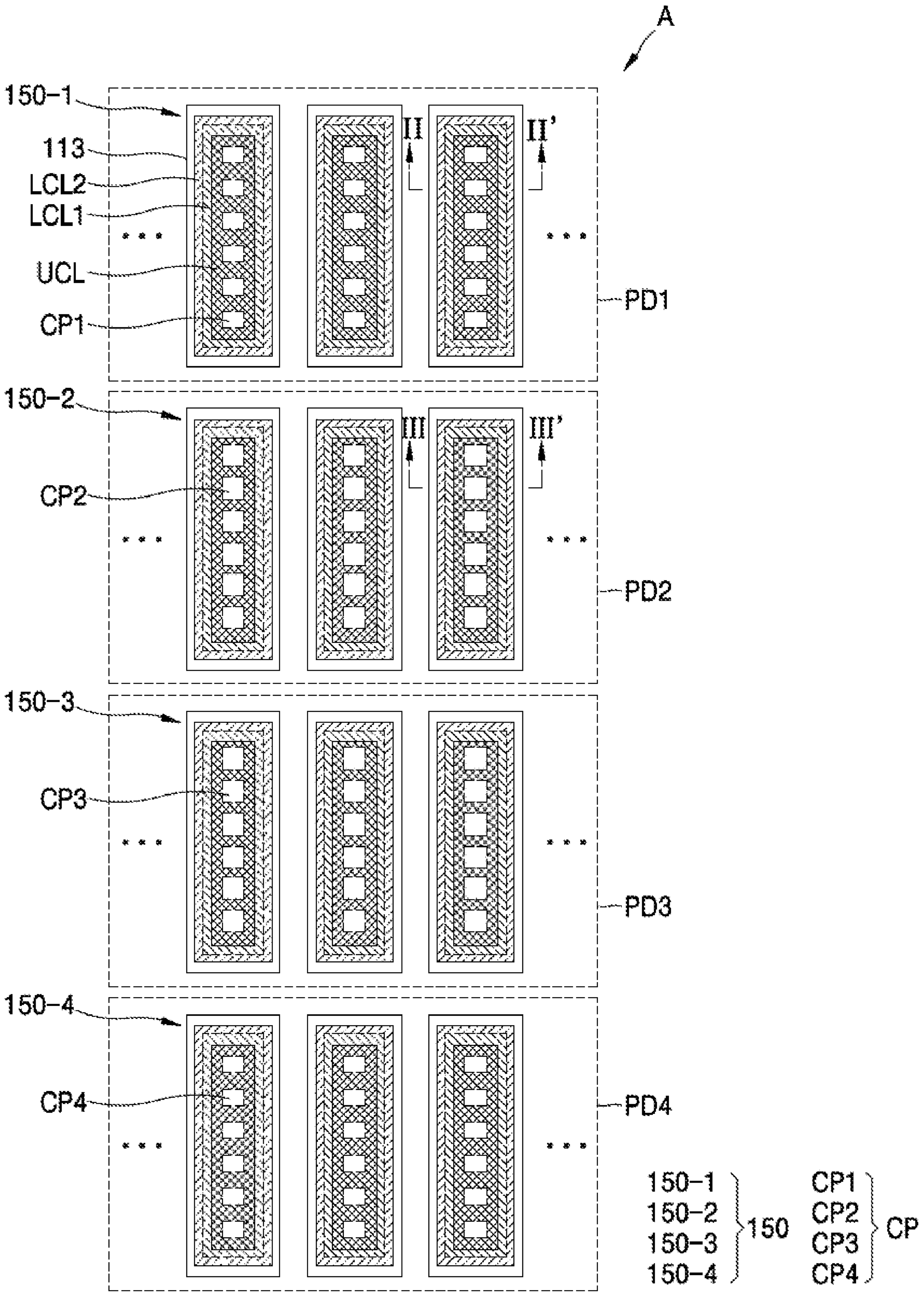
FIG. 6 is an enlarged schematic plan view illustrating a portion of a pad area of a display apparatus, according to an embodiment.
Figure 7A:
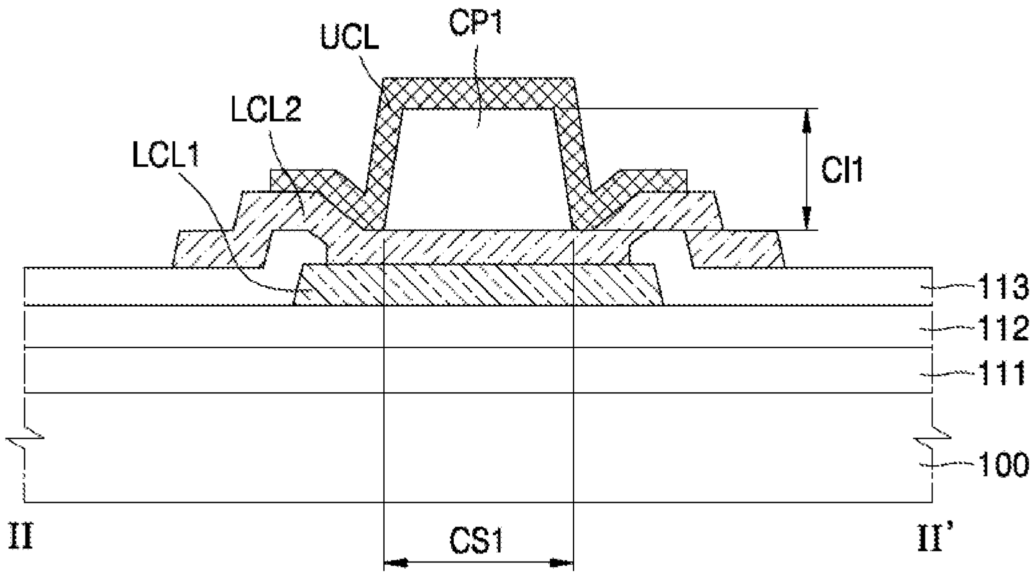
FIG. 7A is a schematic cross-sectional view taken along line II-II' of FIG. 6.
Figure 7B:
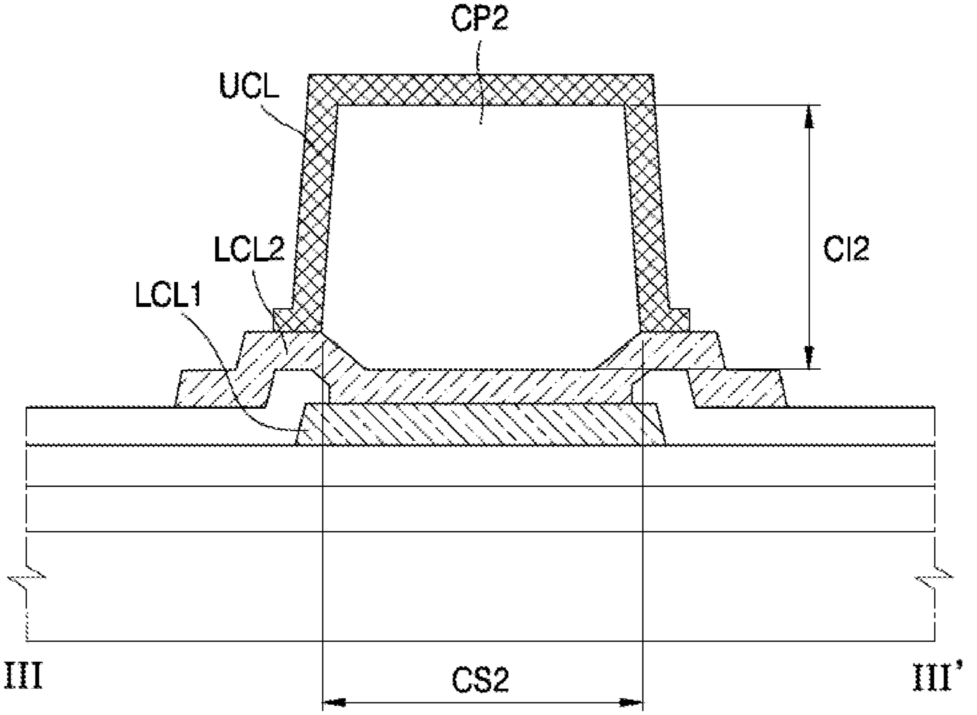
FIG. 7B is a schematic cross-sectional view taken along line III-III' of FIG. 6.

FIG. 6 is an enlarged schematic plan view illustrating a portion of a pad area of a display apparatus, according to an embodiment. FIG. 7A is a schematic cross-sectional view taken along line II-II' of FIG. 6. FIG. 7B is a schematic cross-sectional view taken along line III-III' of FIG. 6. FIG. 6 is an enlarged schematic plan view illustrating a portion A of the pad area PA of FIG. 4.

Referring to FIGS. 6 to 7B, the pad terminals 150 arranged in the first direction (e.g., X direction) may form multiple rows. In an embodiment, n pad terminals 150 may be arranged in each of the rows in the second direction (e.g., Y direction).

For example, n pad terminals 150 may be formed (n is a natural number equal to or greater than 2), and for convenience of explanation, the pad terminals 150 arranged to form four rows are illustrated in FIG. 6. In other words, four pad terminals 150 may be arranged in the second direction (e.g., Y direction).

The rows may include the first pad group PD1 arranged in a first row, the second pad group PD2 arranged in a second row, the third pad group PD3 arranged in a third row, and the fourth pad group PD4 arranged in a fourth row. For convenience of explanation, the pad terminal 150 located in the first pad group PD1 is referred to as a first pad terminal 150-1, the pad terminal 150 located in the second pad group PD2 is referred to as a second pad terminal 150-2, the pad terminal 150 located in the third pad group PD3 is referred to as a third pad terminal 150-3, and the pad terminal 150 located in the fourth pad group PD4 is referred to as a fourth pad terminal 150-4. From among four pad terminals 150-1, 150-2, 150-3 and 150-4 arranged in the second direction (e.g., Y direction), the first pad terminal 150-1 and the fourth pad terminal 150-4 may correspond to pad terminals located at a relatively outer side, and the second pad terminal 150-2 and the third pad terminal 150-3 may correspond to pad terminals located at a relatively inner side.

Each of the pad terminals 150 may include a first lower conductive layer LCL1, a second gate insulating layer 113, a second lower conductive layer LCL2, multiple convex portions CP, and an upper conductive layer UCL.

The buffer layer 111 may be located on the substrate 100, the first gate insulating layer 112 may be located on the buffer layer 111, and the first lower conductive layer LCL1 may be located on the first gate insulating layer 112. The first lower conductive layer LCL1 and the gate electrode GE of the display area DA may be formed of the same material in the same process. For example, the first lower conductive layer LCL1 may include a conductive material including molybdenum (Mo), aluminum (Al), copper (Cu), or titanium (Ti), and may have a single or multi-layer structure including the above material. The first lower conductive layer LCL1 may be electrically connected to a wiring extending from the display area DA.

The second gate insulating layer 113 may be formed on the first gate insulating layer 112 to overlap a part of the first lower conductive layer LCL1 in a plan view. The second gate insulating layer 113 may be an insulating layer for insulating the gate electrode GE from the upper electrode CE2 of the storage capacitor Cst in the display area DA, and may be located in the display area DA and the non-display area NDA. However, because the first lower conductive layer LCL1 and the second lower conductive layer LCL2 are electrically connected to each other in the pad terminals 150, the second gate insulating layer 113 may not be located on the pad terminals 150 of the pad area PA. For example, the second gate insulating layer 113 may be formed to cover only an edge of the first lower conductive layer LCL1.

The second lower conductive layer LCL2 may be located on the first lower conductive layer LCL1 and the second gate insulating layer 113. The second lower conductive layer LCL2 and the upper electrode CE2 of the storage capacitor Cst of the display area DA may be formed of the same material in the same process. For example, the second lower conductive layer LCL2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single or multi-layer structure including the above material.

The second lower conductive layer LCL2 may be electrically connected to the first lower conductive layer LCL1. The second lower conductive layer LCL2 may directly contact the first lower conductive layer LCL1. For example, because a portion of the first lower conductive layer LCL1 other than the edge covered by the second gate insulating layer 113 is exposed, the first lower conductive layer LCL1 and the second lower conductive layer LCL2 may contact each other.

Multiple convex portions CP may be located on the second lower conductive layer LCL2 to be spaced apart from each other. For example, the convex portions CP may be located between the second lower conductive layer LCL2 and the upper conductive layer UCL described below in a cross-sectional view. The convex portions CP may cover at least a portion of the second lower conductive layer LCL2. The convex portions CP may include an organic material, and the organic material may be an organic insulating material or an organic conductive material. In an embodiment, the convex portions CP and at least one of the insulating layers located in the display area DA may be formed of the same material in the same process. The convex portions CP may include first convex portions CP1 located in the first pad terminal 150-1, second convex portions CP2 located in the second pad terminal 150-2, third convex portions CP3 located in the third pad terminal 150-3, and fourth convex portions CP4 located in the fourth pad terminal 150-4.

The upper conductive layer UCL may be located on the second lower conductive layer LCL2. The upper conductive layer UCL may be located in an island shape on the second lower conductive layer LCL2. At least a part of the second lower conductive layer LCL2 and at least a part of the upper conductive layer UCL may be electrically connected to each other in a portion where the convex portions CP are not located. For example, a portion of the upper conductive layer UCL may be located on a portion where the second lower conductive layer LCL2 is exposed, and another portion of the upper conductive layer UCL may be located on the convex portions CP. The upper conductive layer UCL may directly contact and be electrically connected to the bumps 187 of the driving member 180. The upper conductive layer UCL and the source electrode SE and the drain electrode DE of the display area DA may be formed of the same material in the same process. For example, the upper conductive layer UCL may include a conductive material including molybdenum (Mo), aluminum (Al), copper (Cu), or titanium (Ti), and may have a single or multi-layer structure including the above material.

A thickness of the convex portions CP included in the first pad terminal 150-1 and/or the fourth pad terminal 150-4 located at a relatively outer side from among the pad terminals 150 may be less than a thickness of the convex portions CP included in the second pad terminal 150-2 and/or the third pad terminal 150-3 located at a relatively inner side from among the pad terminals 150 in a thickness direction of the substrate 100. For example, as shown in FIGS. 7A and 7B, a thickness CI2 of the second convex portion CP2 may be greater than a thickness CI1 of the first convex portion CP1 and/or a thickness of the fourth convex portion CP4. A thickness of the fourth convex portion CP4 and the thickness CI1 of the first convex portion CP1 may be substantially same. Likewise, a thickness of the third convex portion CP3 may be greater than the thickness CI1 of the first convex portion CP1 and/or a thickness of the fourth convex portion CP4. A thickness of the third convex portion CP3 and the thickness CI2 of the second convex portion CP2 may be substantially same.

According to an embodiment, a thickness of each of the convex portions CP located in the second pad group PD2 and the third pad group PD3 located at a relatively central portion from among the pad terminals 150 may be greater than a thickness of each of the convex portions CP located in the first pad group PD1 and the fourth pad group PD4 located at a relatively outer portion from among the pad terminals 150 in the thickness direction of the substrate 100. Accordingly, a bonding gap between the driving member 180 and the second pad terminal 150-2 and the third pad terminal 150-3 respectively located in the second pad group PD2 and the third pad group PD3 may be reduced. In case that a bonding gap is reduced, because pressure applied to a portion where the second pad terminal 150-2 and the third pad terminal 150-3 are located may be equal to pressure applied to a portion where the first pad terminal 150-1 and the fourth pad terminal 150-4 are located, poor contact and increased resistance between the driving member 180 and the second pad terminal 150-2 and the third pad terminal 150-3 may be avoided. Also, as pressure applied to the pad terminals 150 is uniformly distributed, it may not be necessary to increase pressure to prevent insufficient pressure to pad terminals 150 at a central portion, cracks occurring in and around the pad terminals 150 may be prevented.

In an embodiment, in order to increase a thickness of each of the second convex portion CP2 and the third convex portion CP3, a pattern size in a plan view (or cross-sectional area) of each of the second convex portion CP2 and the third convex portion CP3 may be increased. This is because in case that exposure is performed under the same exposure condition using one mask and a pattern size of the convex portions CP is increased, a thickness of the convex portions CP may also be increased. For example, an overlapping area between the second lower conductive layer LCL2 and the first convex portions CP1 corresponding to the first pad terminal 150-1 and an overlapping area between the second lower conductive layer LCL2 and the second convex portions CP2 corresponding to the second pad terminal 150-2 may be different from each other. For example, an overlapping area between the second lower conductive layer LCL2 and one of the second convex portions CP2 corresponding to the second pad terminal 150-2 may be greater than an overlapping area between the second lower conductive layer LCL2 and one of the first convex portions CP1 corresponding to the first pad terminal 150-1. In another embodiment, a width CS2 of a bottom surface of one of the second convex portions CP2 corresponding to the second pad terminal 150-2 may be greater than a width CS1 of a bottom surface of any one of the first convex portions CP1 corresponding to the first pad terminal 150-1 in a direction. A pattern size of the fourth convex portion CP4 corresponding to the fourth pad terminal 150-4 may be substantially the same as a pattern size of the first convex portion CP1, and a pattern size of the third convex portion CP3 corresponding to the third pad terminal 150-3 may be substantially the same as a pattern size of the second convex portion CP2 in a plan view.

Figure 8:
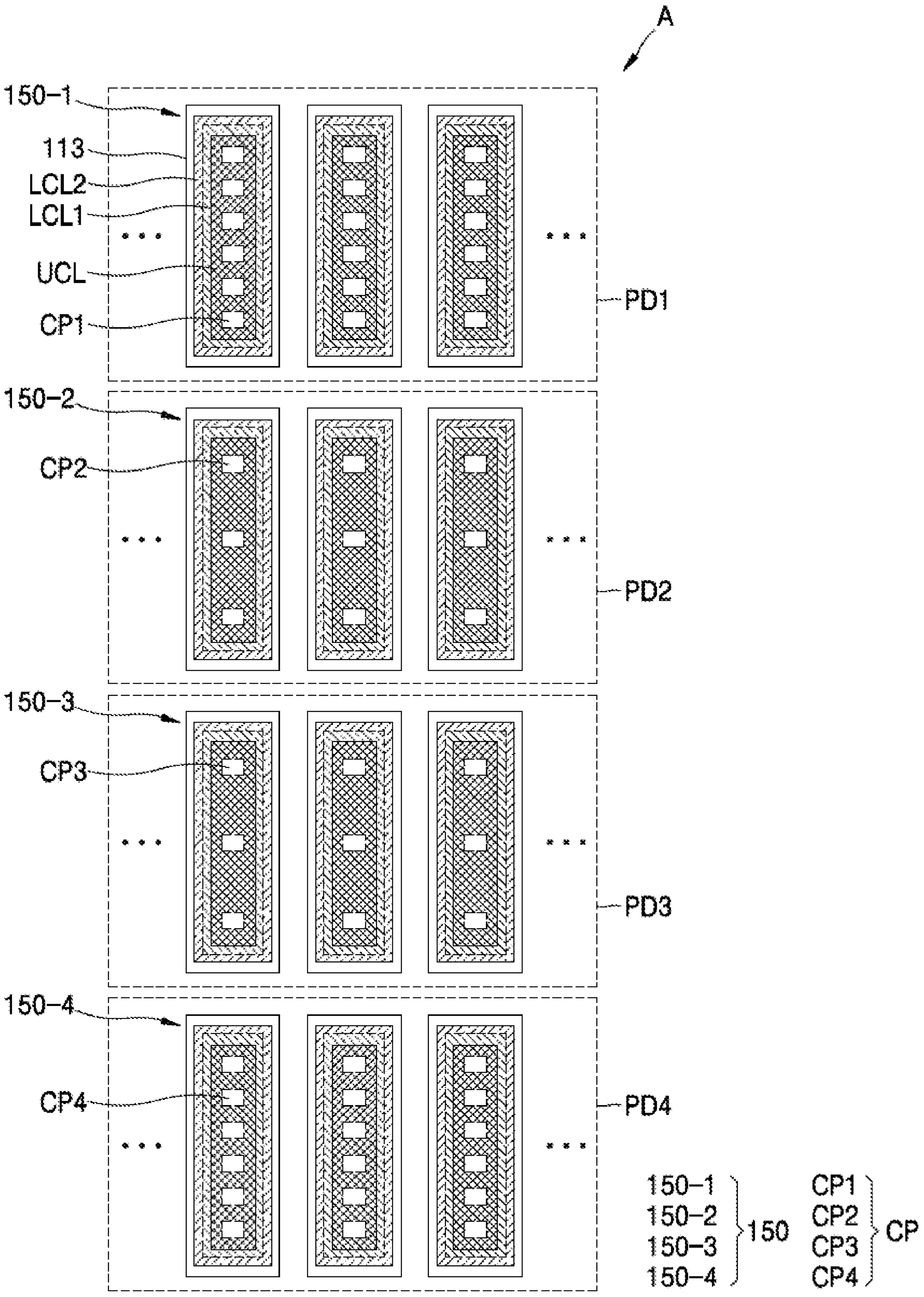
FIG. 8 is an enlarged schematic plan view illustrating a portion of a pad area of a display apparatus, according to another embodiment.

FIG. 8 is an enlarged schematic plan view illustrating a portion of a pad area of a display apparatus, according to another embodiment. Referring to FIG. 8, features other than features of the second convex portion CP2 and the third convex portion CP3 are the same as those described with reference to FIGS. 6 to 7B. In FIG. 8 and FIGS. 6 to 7B, the same elements are denoted by the same reference numerals and a repeated explanation thereof will not be given, and the following will focus on a difference.

Referring to FIG. 8, the number of convex portions CP of the first pad terminals 150-1 and/or the fourth pad terminal 150-4 located at a relatively outer side from among the pad terminals 150 may be greater than the number of convex portions CP of the second pad terminal 150-2 and/or the third pad terminal 150-3 located at a relatively inner side from among the pad terminals 150. For example, the number of second convex portions CP2 corresponding to the second pad terminal 150-2 may be less than the number of first convex portions CP1 corresponding to the first pad terminal 150-1 and/or the number of fourth convex portions CP4 corresponding to the fourth pad terminal 150-4. The number of first convex portions CP1 corresponding to the first pad terminal 150-1 and the number of fourth convex portions CP4 corresponding to the fourth pad terminal 150-4 may be substantially same.

Likewise, the number of third convex portions CP3 corresponding to the third pad terminal 150-3 may be less than the number of first convex portions CP1 corresponding to the first pad terminal 150-1 and/or the number of fourth convex portions CP4 corresponding to the fourth pad terminal 150-4. The number of second convex portions CP2 corresponding to the second pad terminal 150-2 and the number of third convex portions CP3 corresponding to the third pad terminal 150-3 may be substantially same.

In an embodiment, as shown in FIG. 8, each of the first pad terminal 150-1 and the fourth pad terminal 150-4 may include six convex portions CP, and each of the second pad terminal 150-2 and the third pad terminal 150-3 may include three convex portions CP. However, the disclosure is not limited thereto, and as long as the number of each of first convex portions CP1 and fourth convex portions CP4 is greater than the number of each of second convex portions CP2 and third convex portions CP3, the number of convex portions CP may be modified in various ways. Also, although FIG. 8 illustrates that the pad terminals 150 are arranged in four rows, in case that the pad terminals 150 are arranged in more rows, the number of convex portions CP may be modified stepwise. For example, in case that the pad terminals 150 are arranged in six rows, the first row and the sixth row may have more convex portions CP than the second row and the fifth row, and the second row and the fifth row may have more convex portions CP than the third row and the fourth row.

Pattern sizes in a plan view (or cross-sectional areas) and thicknesses of the first convex portion CP1, the second convex portion CP2, the third convex portion CP3, and the fourth convex portion CP4 may be substantially same. However, because the number of second convex portions CP2 and/or the number of third convex portions CP3 is less than the number of first convex portions CP1 and/or the number of fourth convex portions CP4 located in each pad terminal 150, a total overlapping area between the second lower conductive layer LCL2 of the first pad terminal 150-1 and the first convex portions CP1 and/or a total overlapping area between the second lower conductive layer LCL2 of the fourth pad terminal 150-4 and the fourth convex portions CP4 may be greater than a total overlapping area between the second lower conductive layer LCL2 of the second pad terminal 150-2 and the second convex portions CP2 and/or a total overlapping area between the second lower conductive layer LCL2 of the third pad terminal 150-3 and the third convex portions CP3. The first convex portion CP1, the second convex portion CP2, the third convex portion CP3, and the fourth convex portion CP4 may have a structure described with reference to FIG. 7A or a structure described with reference to FIG. 7B.

Because the upper conductive layer UCL is located on the convex portions CP, a contact area between the upper conductive layer UCL of the second pad terminal 150-2 and the bump 187 (see FIG. 5) and/or a contact area between the upper conductive layer UCL of the third pad terminal 150-3 and the bump 187 may be less than a contact area between the upper conductive layer UCL of the first pad terminal 150-1 and the bump 187 and/or a contact area between the upper conductive layer UCL of the fourth pad terminal 150-4 and the bump 187.

As the number of second convex portions CP2 and/or the number of third convex portions CP3 is less than the number of first convex portions CP1 and/or the number of fourth convex portions CP4, a contact area between the second pad terminal 150-2 and the third pad terminal 150-3 and the driving member 180 may be less than a contact area between the first pad terminal 150-1 and the fourth pad terminal 150-4 and the driving member 180. Accordingly, even in case that pressure applied to the second pad terminal 150-2 and the third pad terminal 150-3 located at a relatively central portion is less than pressure applied to the first pad terminal 150-1 and the fourth pad terminal 150-4, pressure applied to each of the second convex portions CP2 and the third convex portions CP3 may be equal to pressure applied to each of the first convex portions CP1 and the fourth convex portions CP4. Accordingly, poor contact and increased resistance between the pad terminals 150 and the driving member 180 may be avoided. Also, because it is no longer necessary to increase pressure to prevent insufficient pressure to pad terminals 150 at a central portion, cracks occurring in and around the pad terminals 150 may be prevented.

Figure 9:
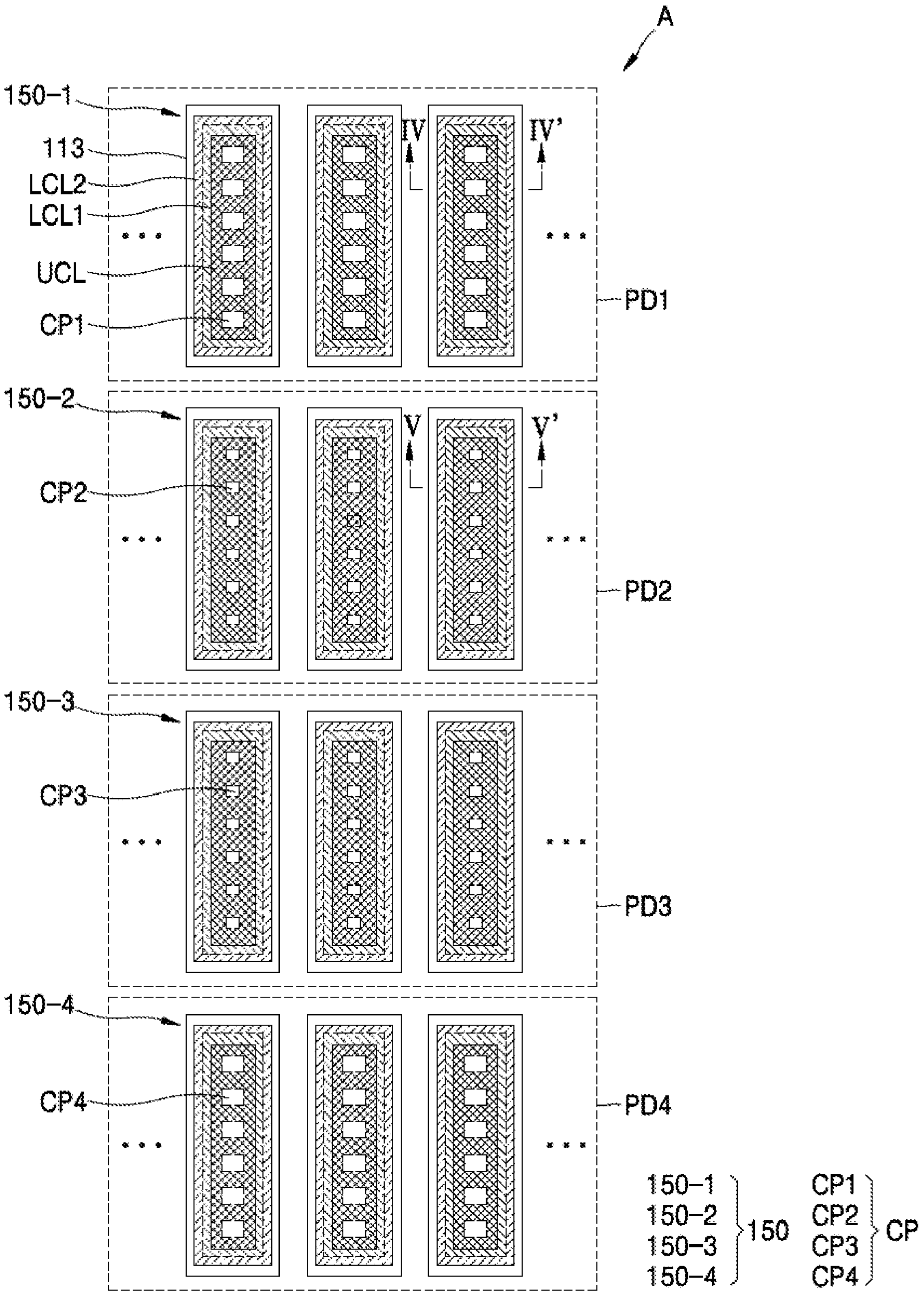
FIG. 9 is an enlarged schematic plan view illustrating a portion of a pad area of a display apparatus, according to another embodiment.
Figure 10A:
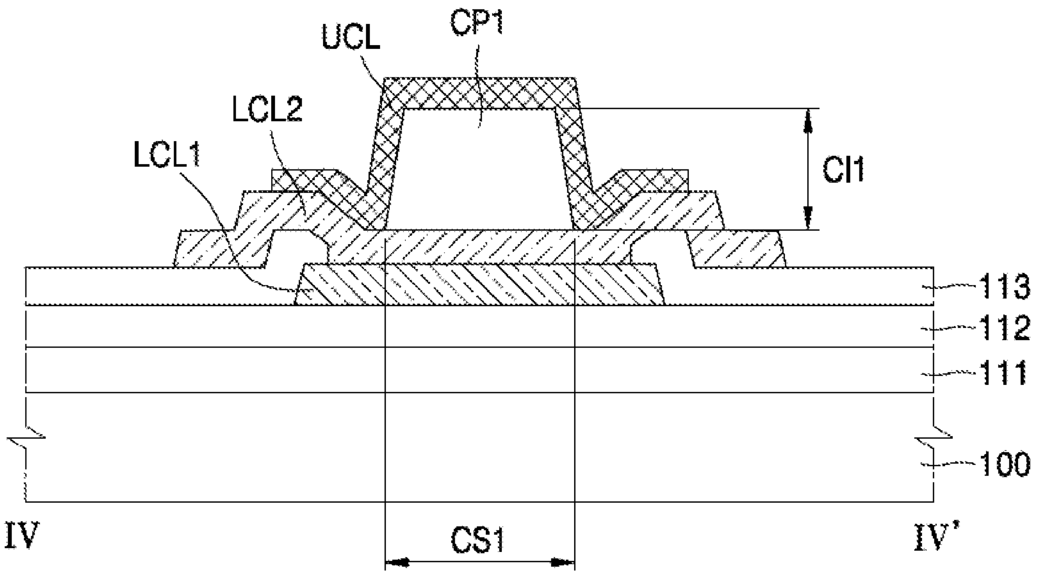
FIG. 10A is a schematic cross-sectional view taken along line IV-IV' of FIG. 9.
Figure 10B:
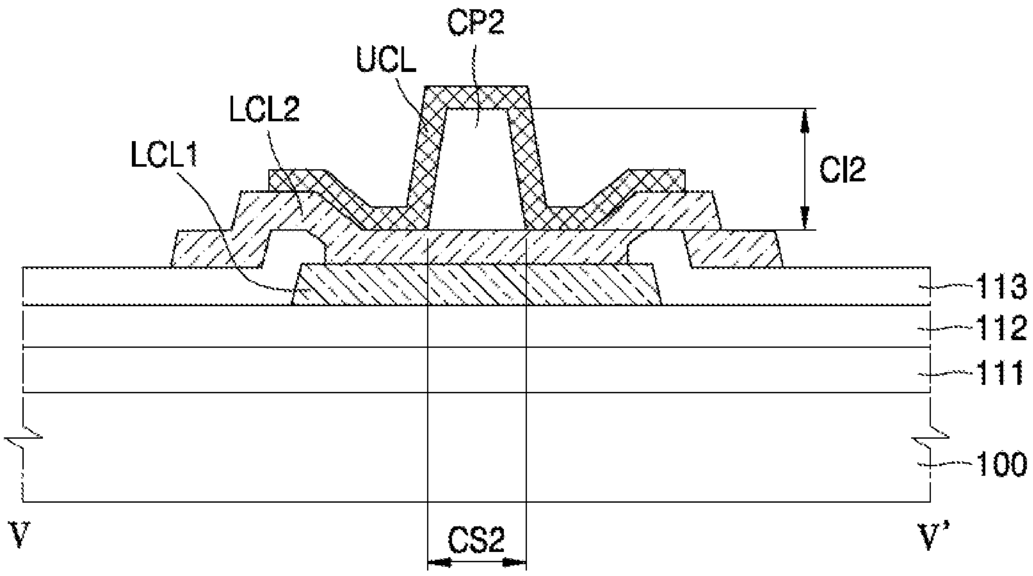
FIG. 10B is a schematic cross-sectional view taken along line V-V' of FIG. 9.

FIG. 9 is an enlarged schematic plan view illustrating a portion of a pad area of a display apparatus, according to another embodiment. FIG. 10A is a schematic cross-sectional view taken along line IV-IV' of FIG. 9. FIG. 10B is a schematic cross-sectional view taken along line V-V' of FIG. 9. Referring to FIGS. 9 to 10B, features other than features of the convex portions CP are the same as those described with reference to FIGS. 6, 7A, and 7B. In FIGS. 9 to 10B and FIGS. 6 to 7B, the same elements are denoted by the same reference numerals and a repeated description thereof will not be given, and the following will focus on a difference.

Referring to FIGS. 9 to 10B, a pattern size in a plan view (or cross-sectional area) of the convex portion CP of the first pad terminal 150-1 and/or the fourth pad terminal 150-4 located at a relatively outer side from among the pad terminals 150 may be greater than a pattern size in a plan view (or cross-sectional area) of the convex portion CP of the second pad terminal 150-2 and/or the third pad terminal 150-3 located at a relatively inner side from among the pad terminals 150. An overlapping area between the second convex portions CP2 of the second pad terminal 150-2 and the second lower conductive layer LCL2 may be less than an overlapping area between the first convex portions CP1 of the first pad terminal 150-1 and the second lower conductive layer LCL2 and/or an overlapping area between the fourth convex portions CP4 of the fourth pad terminal 150-4 and the second lower conductive layer LCL2. Likewise, an overlapping area between the third convex portions CP3 of the third pad terminal 150-3 and the second lower conductive layer LCL2 may be less than an overlapping area between the first convex portions CP1 of the first pad terminal 150-1 and the second lower conductive layer LCL2 and/or an overlapping area between the fourth convex portions CP4 of the fourth pad terminal 150-4 and the second lower conductive layer LCL2. The numbers of the first convex portions CP1, the second convex portions CP2, the third convex portions CP3, and the fourth convex portions CP4 corresponding to the pad terminals 150 may be the same.

For example, a width CS1 of a bottom surface of the first convex portion CP1 located on the second lower conductive layer LCL2 of the first pad terminal 150-1 may be greater than a width CS2 of a bottom surface of the second convex portion CP2 located on the second lower conductive layer LCL2 of the second pad terminal 150-2 in a direction. A width CS1 of a bottom surface of the first convex portion CP1 and a width of a bottom surface of the fourth convex portion CP4 may be same, and a width CS2 of a bottom surface of the second convex portion CP2 and a width of a bottom surface of the third convex portion CP3 may be same.

Although FIG. 9 illustrates that the pad terminals 150 include four rows, the disclosure is not limited thereto, and the convex portions CP may be arranged in more rows. For example, in case that the pad terminals 150 include six rows, the convex portions CP of the first row and the sixth row may have a pattern size greater than a pattern size of the convex portions CP of the second row and the fifth row, and the convex portions CP of the second row and the fifth row may have a pattern size greater than a pattern size of the convex portions CP of the third row and the fourth row in a plan view.

A thickness of the convex portions CP located in the first pad terminal 150-1 and/or the fourth pad terminal 150-4 located at a relatively outer side from among the pad terminals 150 may be the same as a thickness of the convex portions CP located in the second pad terminal 150-2 and/or the third pad terminal 150-3 located at a relatively inner side from among the pad terminals 150 in the thickness direction of the substrate 100. Thicknesses of the first convex portions CP1, the second convex portions CP2, the third convex portions CP3, and the fourth convex portions CP4 may be substantially same. A distance from a top surface of the substrate 100 to a top surface of the first convex portion CP1, a distance from the top surface of the substrate 100 to a top surface of the second convex portion CP2, a distance from the top surface of the substrate 100 to a top surface of the third convex portion CP3, and a distance from the top surface of the substrate 100 to a top surface of the fourth convex portion CP4 may be same.

Because a pattern size of the first convex portion CP1 and/or the fourth convex portion CP4 located in each pad terminal 150 is greater than a pattern size of the second convex portion CP2 and/or the third convex portion CP3 in a plan view, a total overlapping area between the second lower conductive layer LCL2 of the first pad terminal 150-1 and the first convex portions CP1 and/or a total overlapping area between the second lower conductive layer LCL2 of the fourth pad terminal 150-4 and the fourth convex portions CP4 may be greater than a total overlapping area between the second lower conductive layer LCL2 of the second pad terminal 150-2 and the second convex portions CP2 and/or a total overlapping area between the second lower conductive layer LCL2 of the third pad terminal 150-3 and the third convex portions CP3.

Because a portion of the upper conductive layer UCL is located on the convex portions CP, a contact area between the upper conductive layer UCL of the second pad terminal 150-2 and the bump 187 (see FIG. 5) and/or a contact area between the upper conductive layer UCL of the third pad terminal 150-3 and the bump 187 may be less than a contact area between the upper conductive layer UCL of the first pad terminal 150-1 and the bump 187 and/or a contact area between the upper conductive layer UCL of the fourth pad terminal 150-4 and the bump 187.

As a pattern size of the second convex portion CP2 and/or the third convex portion CP3 is less than a pattern size of the first convex portion CP1 and/or the fourth convex portion CP4 in a plan view, a contact area between the second pad terminal 150-2 and/or the third pad terminal 150-3 and the driving member 180 may be less than a contact area between the first pad terminal 150-1 and/or the fourth pad terminal 150-4 and the driving member 180. Accordingly, even in case that pressure applied to the second pad terminal 150-2 and the third pad terminal 150-3 located at a relatively central portion is less than pressure applied to the first pad terminal 150-1 and the fourth pad terminal 150-4, pressure applied to each of the second convex portions CP2 and the third convex portions CP3 may be equal to pressure applied to each of the first convex portions CP1 and the fourth convex portions CP4. Accordingly, poor contact and increased resistance between the pad terminals 150 and the driving member 180 may be avoided. Also, because it is no longer necessary to increase pressure to prevent insufficient pressure to pad terminals 150 at a central portion, cracks occurring in and around the pad terminals 150 may be prevented.

Figure 11:
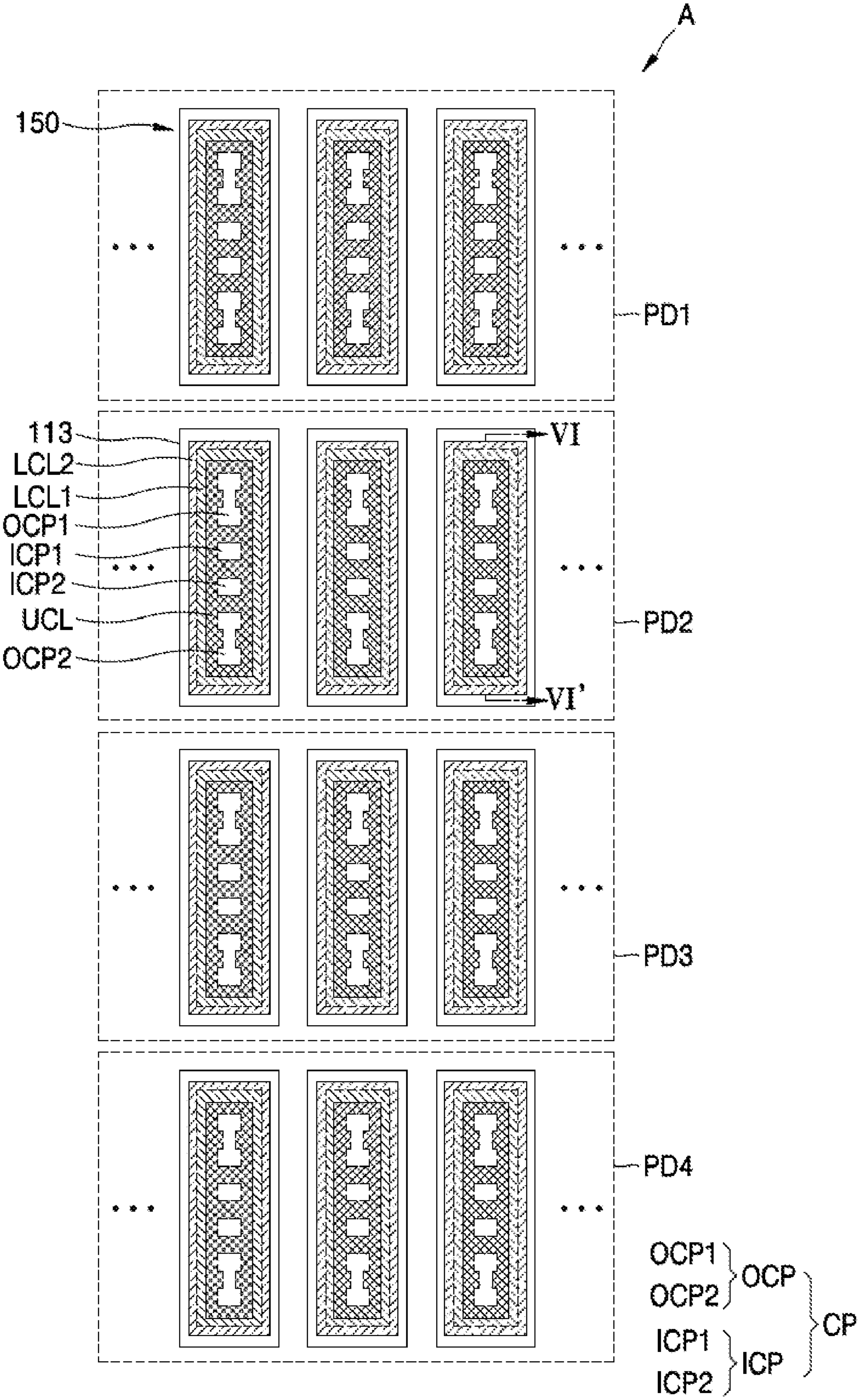
FIG. 11 is an enlarged schematic plan view illustrating a portion of a pad area of a display apparatus, according to another embodiment.
Figure 12:
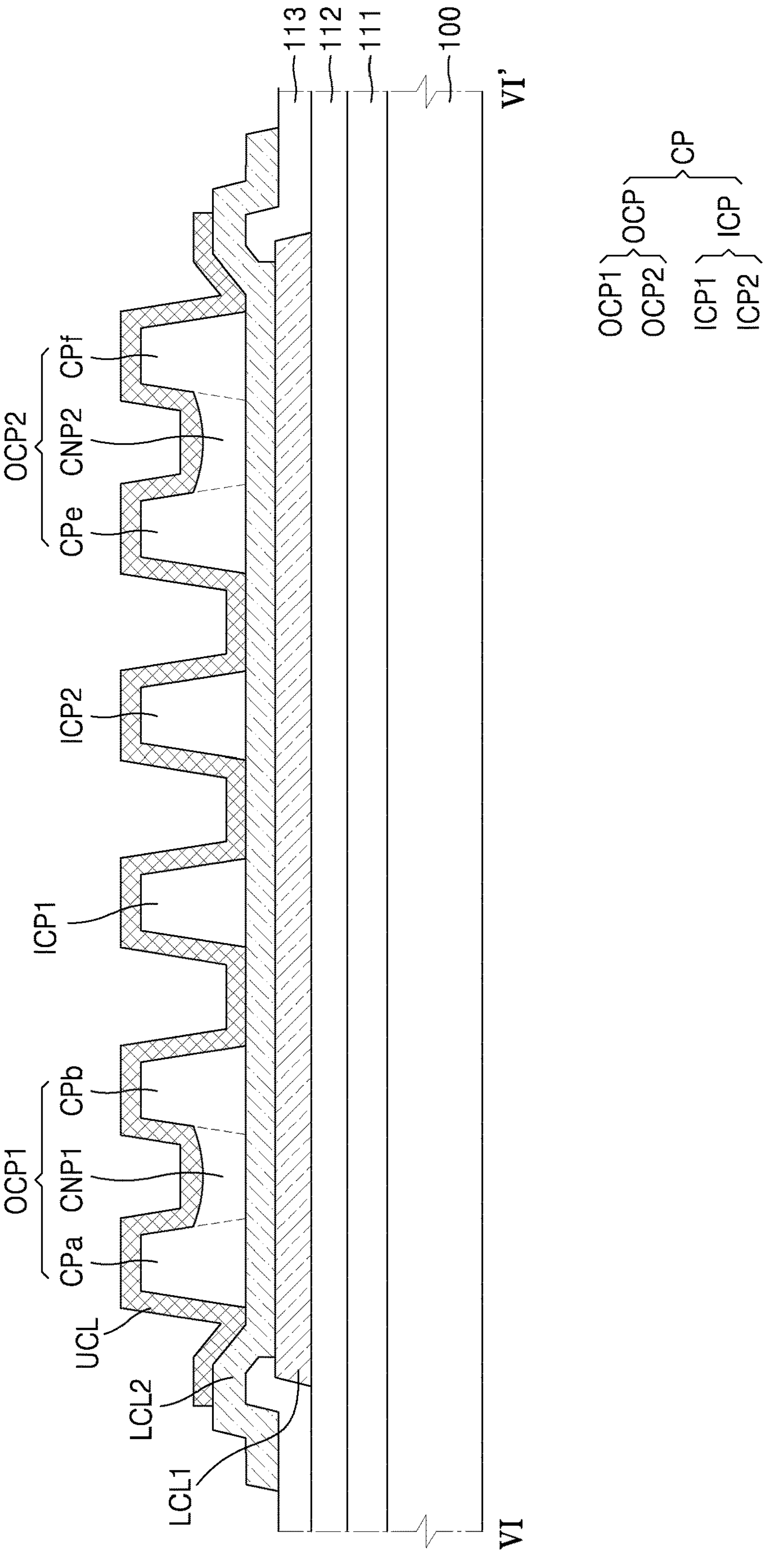
FIG. 12 is a schematic cross-sectional view taken along line VI-VI' of FIG. 11.

FIG. 11 is an enlarged schematic plan view illustrating a portion of a pad area of a display apparatus, according to another embodiment. FIG. 12 is a schematic cross-sectional view taken along line VI-VI' of FIG. 11. Referring to FIGS. 11 and 12, features other than features of the convex portions CP are the same as those described with reference to FIGS. 6, 7A, and 7B. In FIGS. 11 and 12 and FIGS. 6, 7A, and 7B, the same elements are denoted by the same reference numerals and a repeated description thereof will not be given, and the following will focus on a difference.

Referring to FIGS. 11 and 12, the convex portions CP located in the first pad terminal 150-1, the second pad terminal 150-2, the third pad terminal 150-3, and the fourth pad terminal 150-4 located at a relatively outer side from among the plurality of pad terminals 150 may have substantially the same structure.

However, convex portions CP located in each pad terminal 150 may be arranged in the second direction (e.g., Y direction), and outer convex portions OCP located at a relatively outer side may be formed to be different from inner convex portions ICP located at a relatively inner side from among the convex portions CP located in each pad terminal 150. For convenience of explanation, FIGS. 11 and 12 illustrate four convex portions CP arranged in each pad terminal 150. However, the disclosure is not limited thereto.

The outer convex portion OCP may include a first portion having a first thickness and a second portion having a second thickness less than the first thickness in the thickness direction of the substrate 100. In an embodiment, as shown in FIG. 12, first and second outer convex portions OCP1 and OCP2 respectively located on each outer side may include first portions CPa, CPb, CPe, and CPf having the first thickness, and connecting portions CNP1 and CNP2 (or second portions) that connect the first portions CPa, CPb, CPe, and CPf. The first portions CPa, CPb, CPe, and CPf and the connecting portions CNP1 and CNP2 may be integrally formed of the same material. However, the connecting portions CNP1 and CNP2 may be formed by using a halftone mask, to have a thickness less than that of the first portions CPa, CPb, CPe, and CPf.

The outer convex portions OCP may include multiple convex portions to have an uneven top surface (e.g., the first portions CPa, CPb, CPe, and CPf), and the inner convex portions ICP located at a relatively inner side may have a single height in the thickness direction. For example, a first inner convex portion ICP1 and a second inner convex portion ICP2 may have a single convex structure having substantially the same thickness as that of the first portions CPa, CPb, CPe, and CPf of the outer convex portions OCP1 and OCP2.

Cross-sectional shapes of the first outer convex portion OCP1 and the second outer convex portion OCP2 located at a relatively outer side from among the convex portions CP located in each pad terminal 150 may be different from cross-sectional shapes of the first inner convex portion ICP1 and the second inner convex portion ICP2 located at a relatively inner side. For example, a volume and an area in a cross-sectional view of the first outer convex portion OCP1 and/or the second outer convex portion OCP2 may be greater than a volume and an area in a cross-sectional view of the first inner convex portion ICP1 and/or the second inner convex portion ICP2. Also, a width of a bottom surface of the first outer convex portion OCP1 and/or the second outer convex portion OCP2 may be greater than a width of a bottom surface of the first inner convex portion ICP1 and/or the second inner convex portion ICP2 in a direction.

Accordingly, in the display apparatus according to the embodiment, in case that the pad terminals 150 and the driving member 180 are bonded to each other, pressure may be uniformly distributed to the convex portions CP. As described above, in case that the pad terminals 150 and the driving member 180 are bonded to each other, the convex portions CP located in the first pad terminal 150-1 (see FIG. 6) and the fourth pad terminal 150-4 (see FIG. 6) located at a relatively outer side from among the pad terminals 150 may receive more pressure. The outer convex portions OCP located at a relatively outer side from among the convex portions CP aligned in each pad terminal 150 may receive more pressure than the inner convex portions ICP located at a relatively inner side.

In case that the pad terminals 150 and the driving member 180 (see FIG. 1) are bonded to each other, stress may be applied to a portion of the substrate 100, and in case that stress is large, the adhesive layer 103 (see FIG. 5) may be pushed. For example, the adhesive layer 103 may be deformed so that a thickness of a central portion overlapping the inner convex portions ICP decreases and a thickness of an outer portion overlapping the outer convex portions OCP increases. Accordingly, in case that the driving member 180 and the pad terminal 150 are bonded to each other, stress may be concentrated on the outer convex portions OCP and around them. Pressure non-uniformity between the outer convex portion OCP and the inner convex portion ICP may cause poor contact and non-uniform resistance.

However, in case that the outer convex portion OCP located at a relatively outer side from among the convex portions CP has higher support strength than the inner convex portion ICP located at a relatively inner side, pressure non-uniformity between the outer convex portion OCP and the inner convex portion ICP may be avoided. For example, the first outer convex portion OCP1 and the second outer convex portion OCP2 may have a wider area for distributing pressure than the area for distributing pressure of the first inner convex portion ICP1 and the second inner convex portion ICP2, and thus, may have high support strength. Accordingly, the first outer convex portion OCP1 and the second outer convex portion OCP2 may distribute pressure applied during bonding, so that pressure between the convex portions CP is uniformly distributed. As a result, as pressure applied to the convex portions CP becomes uniform, a bonding gap deviation between the pad terminals 150 and the driving member 180 may be reduced, thereby avoiding poor contact and increased resistance.

Figure 13:
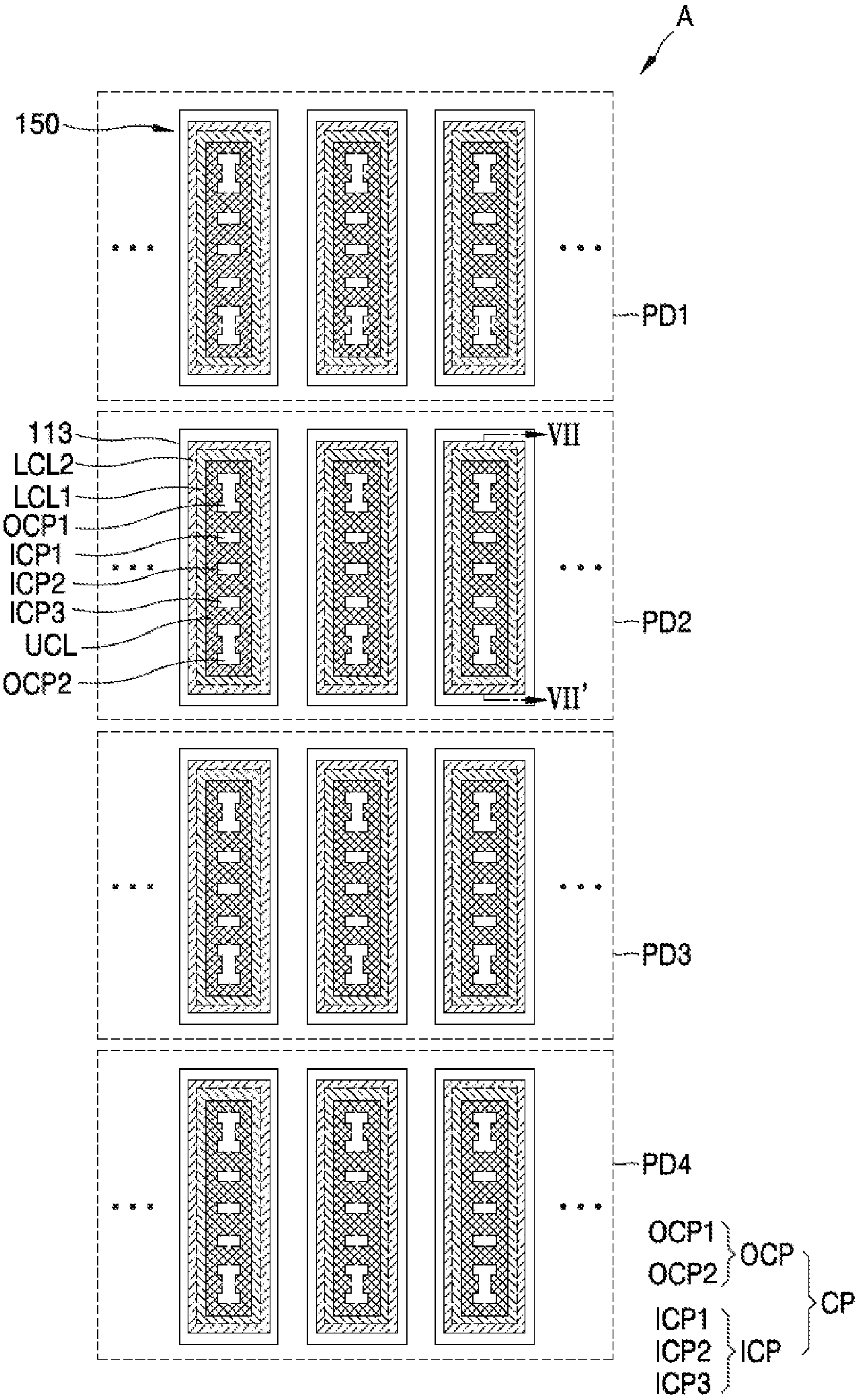
FIG. 13 is an enlarged schematic plan view illustrating a portion of a pad area of a display apparatus, according to another embodiment.
Figure 14:
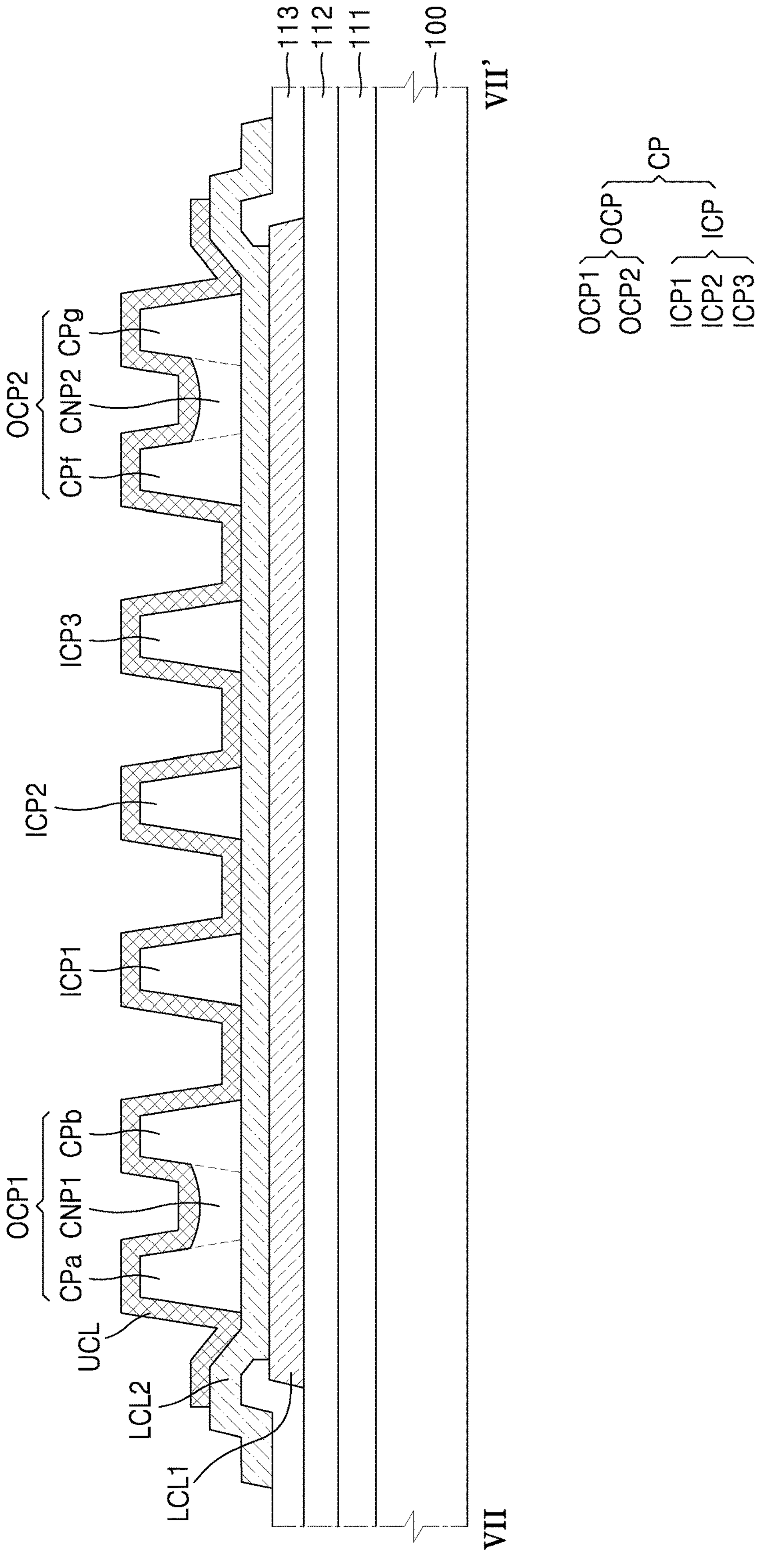
FIG. 14 is a schematic cross-sectional view taken along line VII-VII' of FIG. 13.

FIG. 13 is an enlarged schematic plan view illustrating a portion of a pad area of a display apparatus, according to another embodiment. FIG. 14 is a schematic cross-sectional view taken along line VII-VII' of FIG. 13. Referring to FIGS. 13 and 14, features other than features of the convex portions CP are the same as those described with reference to FIGS. 11 and 12. In FIGS. 13 and 14 and FIGS. 11 and 12, the same elements are denoted by the same reference numerals and a repeated description thereof will not be given, and the following will focus on a difference.

Referring to FIGS. 13 and 14, multiple outer convex portions OCP located at a relatively outer side from among the convex portions CP located in each pad terminal 150 may have different structure from multiple inner convex portions ICP located at a relatively inner side from among the convex portions CP located in each pad terminal 150. For convenience of explanation, FIGS. 13 and 14 will be described assuming that five convex portions CP are arranged in each pad terminal 150. However, the disclosure is not limited thereto.

The outer convex portion OCP may include a first portion having a first thickness and a second portion having a second thickness less than the first thickness in the thickness direction. In an embodiment, as shown in FIG. 14, first and second outer convex portions OCP1 and OCP2 respectively located on each outer side may include four first portions CPa, CPb, CPf, and CPg having the first thickness and two connecting portions CNP1 and CNP2 (or second portions) that connect the first portions CPa, CPb, CPf, and CPg. The first portions CPa, CPb, CPf, and CPg and the connecting portions CNP1 and CNP2 may be integrally formed of the same material. However, the connecting portions CNP1 and CNP2 may be formed by using a halftone mask, to have a thickness less than a thickness of the first portions CPa, CPb, CPf, and CPg in the thickness direction.

The outer convex portions OCP may include multiple convex portions to have an uneven top surface (e.g., the first portions CPa, CPb, CPf, and CPg), and the inner convex portions ICP located at a relatively inner side may have a single height. In an embodiment, as shown in FIG. 14, the inner convex portion ICP may include a first inner convex portion ICP1, a second inner convex portion ICP2, and a third inner convex portion ICP3. For example, the first inner convex portion ICP1, the second inner convex portion ICP2, and the third inner convex portion ICP3 may have a same convex structure having substantially the same thickness as a thickness of the first portions CPa, CPb, CPf, and CPg of the outer convex portions OCP1 and OCP2.

Cross-sectional shapes of the first outer convex portion OCP1 and the second outer convex portion OCP2 located at a relatively outer side from among the convex portions CP located in each pad terminal 150 may be different from cross-sectional shapes of the first inner convex portion ICP1, the second inner convex portion ICP2, and the third inner convex portion ICP3 located at a relatively inner side. For example, a volume and an area in a cross-sectional view of the first outer convex portion OCP1 and/or the second outer convex portion OCP2 may be greater than a volume and an area in a cross-sectional view of the first inner convex portion ICP1, the second inner convex portion ICP2, and/or the third inner convex portion ICP3. Also, a width of a bottom surface of the first outer convex portion OCP1 and/or the second outer convex portion OCP2 may also be greater than a width of a bottom surface of the first inner convex portion ICP1, the second inner convex portion ICP2, and/or the third inner convex portion ICP3 in a direction.

Accordingly, in the display apparatus according to the embodiment, in case that the pad terminals 150 and the driving member 180 (see FIG. 1) are bonded to each other, pressure may be uniformly distributed to the convex portions CP. For example, the first outer convex portion OCP1 and the second outer convex portion OCP2 may have a wider area for distributing pressure than the area for distributing pressure of the first inner convex portion ICP1, the second inner convex portion ICP2, and the third inner convex portion ICP3, and thus, may have high support strength. Accordingly, the first outer convex portion OCP1 and the second outer convex portion OCP2 may distribute pressure applied during bonding, so that pressure between the convex portions CP is uniformly distributed. As a result, as pressure applied to the convex portions CP becomes uniform, a bonding gap deviation between the pad terminals 150 and the driving member 180 may be reduced, thereby avoiding poor contact and increased resistance.

Figure 15:
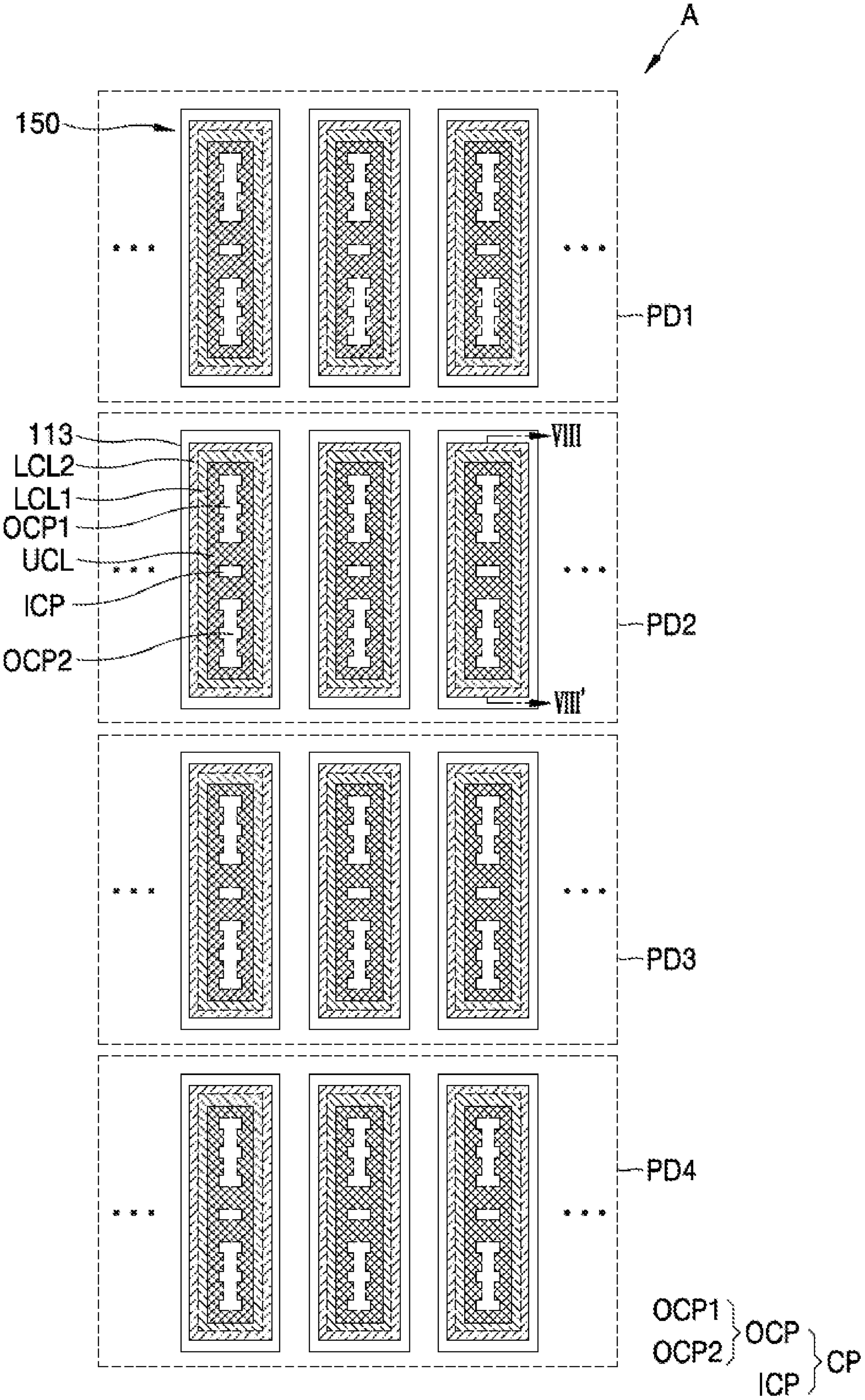
FIG. 15 is an enlarged schematic plan view illustrating a portion of a pad area of a display apparatus, according to another embodiment.
Figure 16:
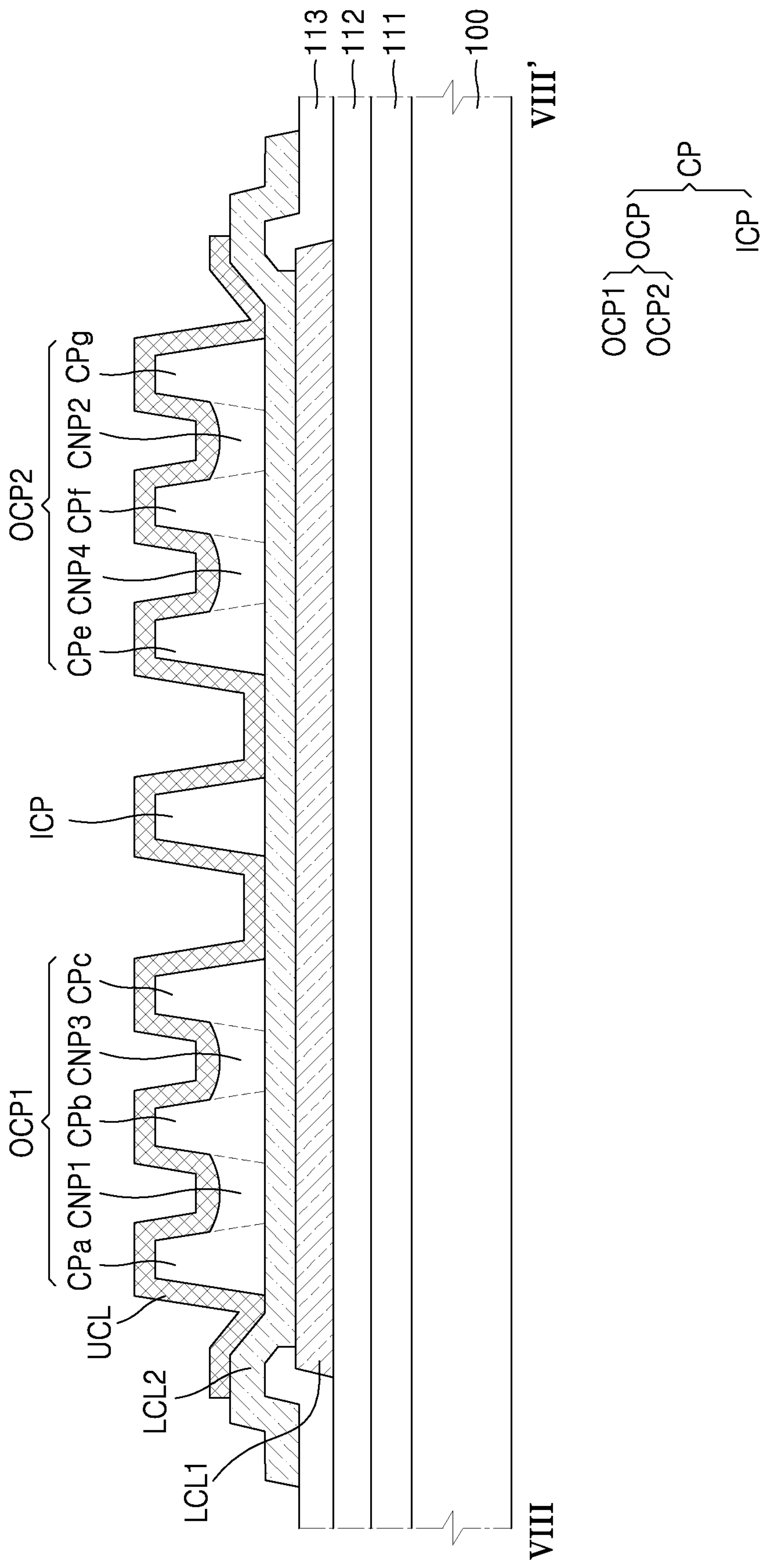
FIG. 16 is a schematic cross-sectional view taken along line VIII-VIII' of FIG. 15.

FIG. 15 is an enlarged schematic plan view illustrating a portion of a pad area of a display apparatus, according to another embodiment. FIG. 16 is a schematic cross-sectional view taken along line VIII-VIII' of FIG. 15. Referring to FIGS. 15 and 16, features other than features of the convex portions CP are the same as those described with reference to FIGS. 11 and 12. In FIGS. 15 and 16 and FIGS. 11 and 12, the same elements are denoted by the same reference numerals and a repeated description thereof will not be given, and the following will focus on a difference.

Referring to FIGS. 15 and 16, multiple outer convex portions OCP located at a relatively outer side from among the convex portions CP located in each pad terminal 150 may have different structure from multiple inner convex portions ICP located at a relatively inner side from among the convex portions CP located in each pad terminal 150. For convenience of explanation, FIGS. 15 and 16 will be described assuming that three convex portions CP are arranged in each pad terminal 150. However, the disclosure is not limited thereto.

The outer convex portion OCP may include a first portion having a first thickness and a second portion having a second thickness less than the first thickness in the thickness direction. In an embodiment, as shown in FIG. 16, first and second outer convex portions OCP1 and OCP2 respectively located on each outer side may include six first portions CPa, CPb, CPc, CPe, CPf, and CPg having the first thickness and four connecting portions CNP1, CNP2, CNP3, and CNP4 (or second portions) that connect the first portions CPa, CPb, CPc, CPe, CPf, and CPg. The first portions CPa, CPb, CPc, CPe, CPf, and CPg and the connecting portions CNP1, CNP2, CNP3, and CNP4 may be integrally formed of the same material. However, the connecting portions CNP1, CNP2, CNP3 and CNP4 may be formed by using a halftone mask, to have a thickness less than that of the first portions CPa, CPb, CPc, CPe, CPf, and CPg in the thickness direction.

The outer convex portions OCP may include multiple convex portions to have an uneven top surface (e.g., the first portions CPa, CPb, CPc, CPe, CPf, and CPg), and the inner convex portion ICP located at a relatively inner side may have a same height. For example, the inner convex portion ICP may have a convex structure having substantially the same thickness similar to the structures of the first portions CPa, CPb, CPc, CPe, CPf, and CPg of the outer convex portions OCP1 and OCP2.

Cross-sectional shapes of the first outer convex portion OCP1 and the second outer convex portion OCP2 located at a relatively outer side from among the convex portions CP located in each pad terminal 150 may be different from a cross-sectional shape of the inner convex portion ICP located at a relatively inner side. For example, a volume and an area in a cross-sectional view of the first outer convex portion OCP1 and/or the second outer convex portion OCP2 may be greater than a volume and an area in a cross-sectional view of the inner convex portion ICP. Also, a width of a bottom surface of the first outer convex portion OCP1 and/or the second outer convex portion OCP2 may be greater than a width of a bottom surface of the inner convex portion ICP in a direction.

Accordingly, in the display apparatus according to the embodiment, because several of the first portions CPa, CPb, CPc, CPe, CPf, and CPg are combined with each other to form the outer convex portion OCP, in case that the pad terminals 150 and the driving member 180 (see FIG. 1) are bonded to each other, pressure may be more uniformly distributed to the convex portions CP. For example, the first outer convex portion OCP1 and the second outer convex portion OCP2 may have much wider area for distributing pressure than the area for distributing pressure of the inner convex portion ICP, and thus, may have very high support strength. Accordingly, the first outer convex portion OCP1 and the second outer convex portion OCP2 may distribute pressure applied during bonding, so that pressure between the convex portions CP is more uniformly distributed. As a result, as pressure applied to the convex portions CP becomes uniform, a bonding gap deviation between the pad terminals 150 and the driving member 180 may be reduced, thereby avoiding poor contact and increased resistance.

According to a display apparatus according to an embodiment as described above, because pressure applied during bonding between a pad terminal and a driving terminal is uniformly distributed, connection reliability between the pad terminal and the driving terminal may be improved. These effects are examples, and do not limit the scope of the disclosure.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display apparatus comprising:

a substrate; and n pad terminals disposed on the substrate, arranged in a first direction in a pad area, and comprising a first pad terminal disposed at outer side from among the n pad terminals in the first direction and an $i^{th}$ pad terminal disposed at inner side from among the n pad terminals in the first direction, wherein n is a natural number greater than or equal to 3, i is greater than 1 and less than n, each of the first pad terminal and the $i^{th}$ pad terminal comprises:

a lower conductive layer;

convex portions on the lower conductive layer; and an upper conductive layer disposed on the convex portions and electrically connected to the lower conductive layer, an overlapping area between the lower conductive layer of the first pad terminal and the convex portions of the first pad terminal is different from an overlapping area between the lower conductive layer of the $i^{th}$ pad terminal and the convex portions of the $i^{th}$ pad terminal in a plan view.

2. The display apparatus of claim 1, wherein a thickness of each of the convex portions of the first pad terminal is less than a thickness of each of the convex portions of the $i^{th}$ pad terminal in a thickness direction of the substrate.

3. The display apparatus of claim 1, wherein the overlapping area between the lower conductive layer of the first pad terminal and the convex portions of the first pad terminal is less than the overlapping area between the lower conductive layer of the $i^{th}$ pad terminal and the convex portions of the $i^{th}$ pad terminal in a plan view.

4. The display apparatus of claim 1, wherein a width of a bottom surface of each of the convex portions of the first pad terminal is less than a width of a bottom surface of each of the convex portions of the $i^{th}$ pad terminal in a second direction crossing the first direction.

5. The display apparatus of claim 1, wherein the overlapping area between the lower conductive layer of the first pad terminal and the convex portions of the first pad terminal is greater than the overlapping area between the lower conductive layer of the $i^{th}$ pad terminal and the convex portions of the $i^{th}$ pad terminal in a plan view.

6. The display apparatus of claim 5, wherein a number of the convex portions of the first pad terminal disposed on the lower conductive layer of the first pad terminal is greater than a number of the convex portions of the $i^{th}$ pad terminal disposed on the lower conductive layer of the $i^{th}$ pad terminal.

7. The display apparatus of claim 6, wherein a height of each of the convex portions of the first pad terminal and a height of each of the convex portions of the $i^{th}$ pad terminal are same in a thickness direction of the substrate.

8. The display apparatus of claim 5, wherein a width of a bottom surface of at least one of the convex portions of the first pad terminal disposed on the lower conductive layer of the first pad terminal is greater than a width of a bottom surface of at least one of the convex portions of the $i^{th}$ pad terminal disposed on the lower conductive layer of the $i^{th}$ pad terminal in a second direction crossing the first direction.

9. The display apparatus of claim 8, wherein a height of each of the convex portions of the first pad terminal and a height of each of the convex portions of the $i^{th}$ pad terminal are same in a thickness direction of the substrate.

10. The display apparatus of claim 1, further comprising:

an integrated circuit device disposed on the n pad terminals, wherein the integrated circuit device directly contacts the upper conductive layer.

11. The display apparatus of claim 10, further comprising:

an adhesive tape disposed in a space between the n pad terminals.

12. The display apparatus of claim 11, wherein the adhesive tape is a non-conductive film.

13. The display apparatus of claim 1, wherein the lower conductive layer comprises:

a first lower conductive layer;

an insulating layer covering an edge of the first lower conductive layer and comprising an opening overlapping a part of the first lower conductive layer in a plan view; and a second lower conductive layer electrically connected to the first lower conductive layer through the opening of the insulating layer.

14. The display apparatus of claim 1, wherein the upper conductive layer is disposed on a top surface and a side surface of each of the convex portions and directly contacts the lower conductive layer.

15. A display apparatus comprising:

a substrate; and a pad terminal disposed on the substrate in a pad area, wherein the pad terminal comprises:

a lower conductive layer;

a plurality of convex portions disposed on the lower conductive layer; and an upper conductive layer disposed on the plurality of convex portions and electrically connected to the lower conductive layer, the plurality of convex portions are arranged in a first direction and include an outer convex portion disposed at outer side of the pad terminal and an inner convex portion disposed at inner side than the outer convex portion, a cross-sectional area of the outer convex portion is greater than a cross-sectional area of the inner convex portion.

16. The display apparatus of claim 15, wherein a width of a bottom surface of the outer convex portion is greater than a width of a bottom surface of the inner convex portion in a second direction crossing the first direction.

17. The display apparatus of claim 15, wherein the outer convex portion comprises:

a first portion having a first thickness; and a second portion integrally connected to the first portion and having a second thickness less than the first thickness in a thickness direction of the substrate.

18. The display apparatus of claim 17, wherein a thickness of the inner convex portion and the first thickness of the first portion of the outer convex portion are substantially same in the thickness direction.

19. The display apparatus of claim 15, further comprising:

an integrated circuit device disposed on the pad terminal, wherein the integrated circuit device directly contacts the upper conductive layer.

20. The display apparatus of claim 19, further comprising:

an adhesive tape disposed in a space between a plurality of the pad terminals.

21. The display apparatus of claim 15, wherein the lower conductive layer comprises:

a first lower conductive layer;

an insulating layer covering an edge of the first lower conductive layer and comprising an opening overlapping a part of the first lower conductive layer in a plan view; and a second lower conductive layer electrically connected to the first lower conductive layer through the opening of the insulating layer.

22. The display apparatus of claim 15, wherein the upper conductive layer is disposed on a top surface and a side surface of each of the plurality of convex portions and directly contacts the lower conductive layer.

* * * * *